(12) United States Patent
Moler

(10) Patent No.: US 8,729,774 B2
(45) Date of Patent: May 20, 2014

(54) MULTIPLE ARM SMART MATERIAL ACTUATOR WITH SECOND STAGE

(75) Inventor: Jeffery B. Moler, Sarasota, FL (US)

(73) Assignee: Viking AT, LLC, Sarasota, FL (US)

( * ) Notice: Subject to any disclaimer, the term of this patent is extended or adjusted under 35 U.S.C. 154(b) by 0 days.

(21) Appl. No.: 13/884,834

(22) PCT Filed: Dec. 9, 2011

(86) PCT No.: PCT/US2011/064218
§ 371 (c)(1),
(2), (4) Date: May 10, 2013

(87) PCT Pub. No.: WO2012/079012
PCT Pub. Date: Jun. 14, 2012

(65) Prior Publication Data
US 2013/0234562 A1 Sep. 12, 2013

Related U.S. Application Data

(63) Continuation of application No. PCT/US2011/025292, filed on Feb. 17, 2011.

(60) Provisional application No. 61/421,504, filed on Dec. 9, 2010.

(51) Int. Cl.
*H01L 41/04* (2006.01)
*H01L 41/053* (2006.01)
*H02N 2/02* (2006.01)
*H02N 2/04* (2006.01)

(52) U.S. Cl.
USPC .......................................................... 310/328

(58) Field of Classification Search
CPC ........... H02N 2/02; H02N 20/21; H02N 2/04; H02N 2/043; H01L 41/04; H01L 41/053; H01L 41/09; H01L 41/0946

USPC .................................................. 310/311, 328
See application file for complete search history.

(56) References Cited

U.S. PATENT DOCUMENTS

| 1,922,196 A | 8/1933 | Butler |
| 4,442,372 A | 4/1984 | Roberts |

(Continued)

FOREIGN PATENT DOCUMENTS

| JP | 2006138913 | 6/2006 |
| WO | 2011006028 | 1/2011 |

(Continued)

*Primary Examiner* — Thomas Dougherty
(74) *Attorney, Agent, or Firm* — William G. Giltinan; Carlton Fields Jorden Burt, PA

(57) ABSTRACT

An actuator apparatus comprising a smart material device, a compensator, a movable supporting member, at least three mechanical webs, at least three actuating arms, and a second stage assembly is disclosed wherein the mechanical webs comprise a first resilient member attached to the compensator and a second resilient member attached to said movable supporting member. A piezoelectric or smart material device is affixed between the first mounting surface and the compensator. The actuating arms comprise a first actuating arm end attached to one mechanical web and a second actuating arm end attached to the second stage assembly. The second stage assembly comprises resilient strips having a first end attached to the actuating arm and a second end attached to a second stage attachment surface. Application of an electrical potential causes the smart material device to expand, thereby urging the movable supporting member away from the compensator and causing the first and second resilient members to flex. This in turn causes the actuating arms to move. The resilient strips urge the second stage attachment surface in a direction substantially parallel to the smart material device.

19 Claims, 14 Drawing Sheets

(56) References Cited

U.S. PATENT DOCUMENTS

| | | |
|---|---|---|
| 4,570,095 A | 2/1986 | Uchikawa |
| 4,783,610 A * | 11/1988 | Asano ............ 310/328 |
| 5,096,388 A | 3/1992 | Weinberg |
| 5,751,091 A | 5/1998 | Takahashi et al. |
| 5,828,157 A | 10/1998 | Miki et al. |
| 6,213,739 B1 | 4/2001 | Phallen et al. |
| 6,359,370 B1 | 3/2002 | Chang |
| 6,435,840 B1 | 8/2002 | Sharma et al. |
| 6,548,938 B2 | 4/2003 | Moler et al. |
| 6,717,332 B2 | 4/2004 | Moler et al. |
| 6,737,788 B2 | 5/2004 | Moler et al. |
| 6,759,790 B1 | 7/2004 | Bugel et al. |
| 6,784,599 B1 | 8/2004 | Stoecklein et al. |
| 6,789,087 B1 | 9/2004 | Sako |
| 6,834,419 B2 | 12/2004 | Lopatin et al. |
| 6,836,056 B2 | 12/2004 | Oudshoorn et al. |
| 6,870,305 B2 | 3/2005 | Moler |
| 6,924,586 B2 | 8/2005 | Moler |
| 6,975,061 B2 | 12/2005 | Moler |
| 6,979,933 B2 | 12/2005 | Oudshoorn et al. |
| 7,036,769 B2 * | 5/2006 | Wood ............ 244/11 |
| 7,040,349 B2 | 5/2006 | Moler et al. |
| 7,064,472 B2 | 6/2006 | Pelrine et al. |
| 7,104,768 B2 | 9/2006 | Richter et al. |
| 7,126,259 B2 | 10/2006 | Moler et al. |
| 7,132,781 B2 | 11/2006 | Moler et al. |
| 7,163,385 B2 | 1/2007 | Gharib et al. |
| 7,190,102 B2 | 3/2007 | VanderSluis |
| 7,217,108 B2 | 5/2007 | Herwig et al. |
| 7,258,533 B2 | 8/2007 | Tanner et al. |
| 7,368,856 B2 | 5/2008 | Moler et al. |
| 7,453,187 B2 | 11/2008 | Richards et al. |
| 7,462,976 B2 | 12/2008 | Semmere et al. |
| 7,524,298 B2 | 4/2009 | Gharib et al. |
| 7,560,856 B2 | 7/2009 | Chen et al. |
| 7,564,171 B2 | 7/2009 | Moler et al. |
| 7,667,375 B2 | 2/2010 | Berkcan et al. |
| 7,687,977 B2 | 3/2010 | Xu |
| 7,939,992 B2 * | 5/2011 | Ehrlich ............ 310/328 |
| 2003/0127948 A1 | 7/2003 | Moler et al. |
| 2004/0035106 A1 | 2/2004 | Moler et al. |
| 2004/0263025 A1 | 12/2004 | Moler et al. |
| 2005/0116583 A1 | 6/2005 | Nishio et al. |
| 2005/0146248 A1 | 7/2005 | Moler |
| 2005/0231077 A1 | 10/2005 | Moler et al. |
| 2006/0017349 A1 | 1/2006 | Moler et al. |
| 2006/0159568 A1 | 7/2006 | Lutz |
| 2007/0025868 A1 | 2/2007 | Swayze et al. |
| 2007/0247024 A1 | 10/2007 | Semmere |
| 2008/0038128 A1 | 2/2008 | Haar |
| 2008/0193307 A1 | 8/2008 | Elata et al. |
| 2008/0265712 A1 | 10/2008 | Ulm et al. |
| 2008/0315722 A1 | 12/2008 | Clingman et al. |
| 2009/0152990 A1 | 6/2009 | Brown et al. |
| 2010/0111733 A1 | 5/2010 | Ramunas et al. |
| 2011/0309721 A1 | 12/2011 | Moler |
| 2012/0001518 A1 | 1/2012 | Moler |
| 2012/0038245 A1 | 2/2012 | Moler |
| 2013/0234561 A1 * | 9/2013 | Moler ............ 310/328 |

FOREIGN PATENT DOCUMENTS

| | | |
|---|---|---|
| WO | 2011006164 | 1/2011 |
| WO | 2011029081 | 3/2011 |
| WO | 2011103324 | 8/2011 |
| WO | 2011103328 | 8/2011 |
| WO | 2012079012 | 9/2012 |
| WO | 2012118548 | 9/2012 |

* cited by examiner

MULTIPLE ARM SMART MATERIAL ACTUATOR WITH SECOND STAGE

This application claims priority to provisional application 61/421,504 filed Dec. 9, 2010 and PCT Application No. PCT/US2011/25292 filed Feb. 17, 2011, each of which is incorporated herein in its entirety.

BACKGROUND

The present invention relates to a mechanically amplified, multiple arm smart material actuator apparatus adapted to operate in three dimensions and incorporating a second stage assembly adapted to translate inward or outward movement of the actuating arms to linear movement of a second stage centerpiece. Mechanically amplified smart material actuators are known in the art. Such actuators, however, typically utilize one or two actuating arms and, thus, operate in essentially two dimensions. Such actuators typically require direct attachment of an actuating arm to the structure to be actuated. As a result, the attachment angle between the smart material actuator and the structure to be actuated is typically such that the direction of expansion of the smart material device is at a substantial angle to the direction of movement of the actuating arm(s). Additionally, having two or fewer actuating arms requires the expansion force of the smart material device to be distributed through at most two mechanical webs.

The present invention addresses these limitations by providing a smart material actuator with at least three actuating arms, thereby allowing for operation in three dimensions. The present invention also provides a second stage adapted to allow the movement of the actuating arms to be translated into substantially linear movement in a direction substantially along the central axis of the smart material device.

The present invention further provides a smart material actuator capable of high speed operation. Embodiments of traditional mechanically amplified smart material actuators were susceptible to failure when operated at high speeds in part due to the momentum of the actuating arms placing excess stresses on the mechanical webs. The present invention addresses that limitation by providing dampeners that prevent overextension of the actuating arms, even when the actuator assembly is operated at very high speeds.

The flexibility of the actuator according to the present invention is further enhanced through the use of interchangeable and replaceable parts. Embodiments of actuators according to the present invention allow for mountable actuating arms that permit different actuating arm lengths, materials, and angles to be utilized with a single actuator assembly. As a result, it is possible to assemble many different configurations of actuators from a common set of parts.

This application hereby incorporates by reference, in their entirety, provisional applications 61/421,504, 61/551,530, 61/452,856, 61/504,174 as well as PCT/US2010/041727, PCT/US10/041,461, PCT/US2010/47931, PCT/US2011/25299, U.S. patent application Ser. Nos. 13/203,737, 13/203,729, 13/203,743 and 13/203,345, and U.S. Patents:

U.S. Pat. No. 6,717,332;
U.S. Pat. No. 6,548,938;
U.S. Pat. No. 6,737,788;
U.S. Pat. No. 6,836,056;
U.S. Pat. No. 6,879,087;
U.S. Pat. No. 6,924,586;
U.S. Pat. No. 6,870,305;
U.S. Pat. No. 6,975,061;
U.S. Pat. No. 7,564,171; and
U.S. Pat. No. 7,368,856.

BRIEF DESCRIPTION OF THE DRAWINGS

Other features in the invention will become apparent from the attached drawings, which illustrate certain preferred embodiments of the apparatus of this invention, wherein.

DETAILED DESCRIPTION

Figure 1:
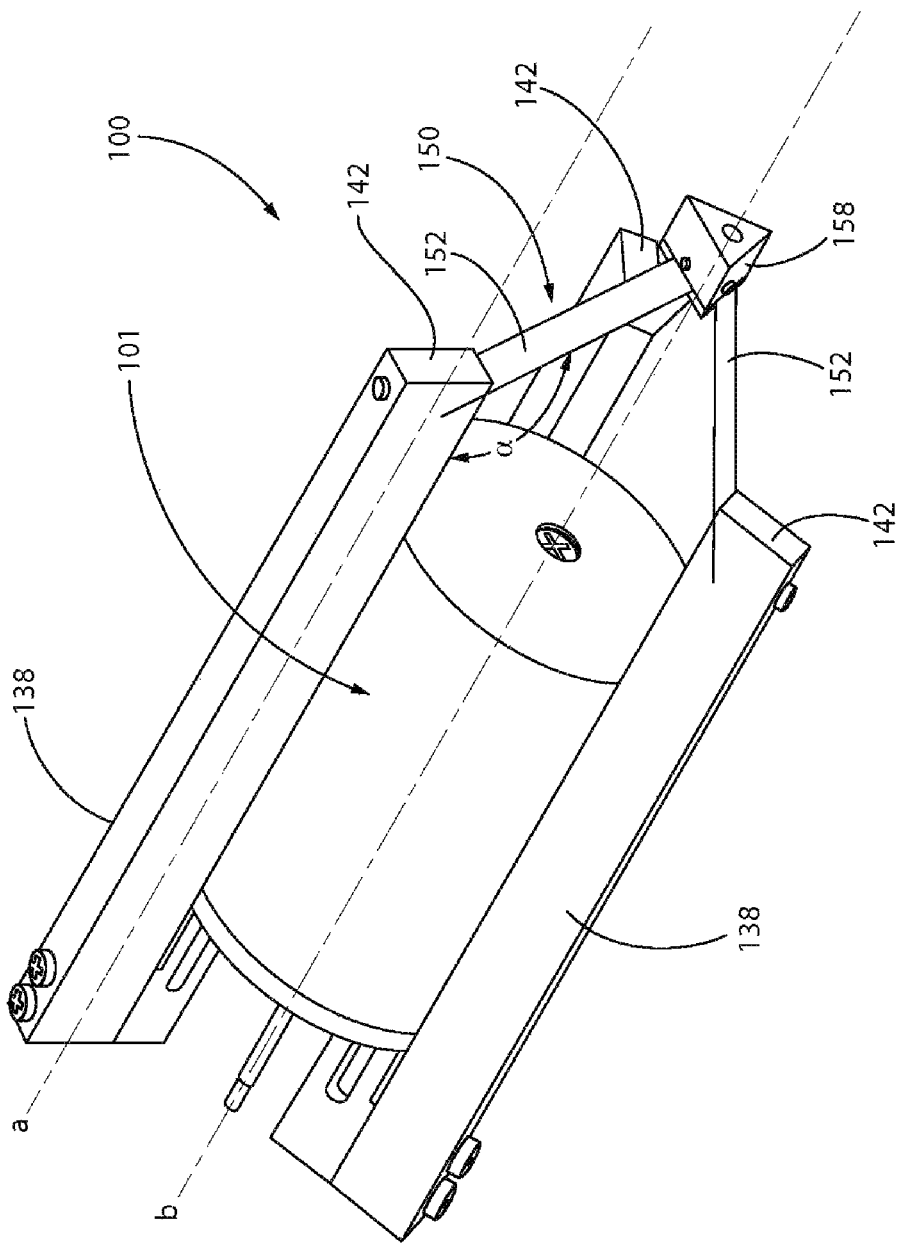
FIG. 1 is a perspective view of a preferred embodiment of the actuator assembly of the apparatus of the present invention having three actuating arms and a second stage.

While the following describes preferred embodiments of this invention, it is understood that this description is to be considered only as illustrative of the principles of the invention and is not to be limitative thereof, as numerous other variations, all within the scope of the invention, will readily occur to others.

It will be noted that in the illustrated embodiments, different embodiments comprise the same or similar components. This is preferred as it reduces manufacturing and repair costs by allowing for use of interchangeable part, and also allows for assembly of a broader variety of actuator assemblies. Where the same component is suitable for use in different embodiments, the same reference number is used. For example, and without limitation, actuating arm 138 is illustrated as a common component that may be used in embodiments including 100, 200, and 400. Accordingly, the same number is used to indicate the common part used in the illustration of each assembly. Where components in different embodiments have a similar structure, but are not necessarily common parts, a prime is used. For example, and without limitation, actuating arms 138, 138', 138'', 138''' are all actuating arms with similar structures and functions. However, actuating arm 138' is modified to extend at a different angle than actuating arm 138, actuating arm 138'' is modified to allow the use of dampeners and 138''' is modified to allow an inward facing second stage. Accordingly, the same element number is utilized with prime notation to indicate distinct variations. Finally, it will be noted that letters are used herein to designate axes defined by two or more points through which the axis runs, and Greek letter designations such as α, and β, are used to indicate angles between such axes, or between such axes and other elements, in order to describe preferred angles appropriate for use in various embodiments described herein.

Herein, the following terms shall have the following meanings:

The term "adapted" shall mean sized, shaped, configured, dimensioned, oriented and arranged as appropriate.

The term "smart material device" shall mean a device comprising a material that expands when an electric potential is applied or generates an electric charge when mechanical force is applied. Smart material devices include, without limitation, devices formed of alternating layers of ceramic piezoelectric material fired together (a so-called co-fired multilayer ceramic piezoelectric stack such as those available from suppliers including NEC) or a device formed of one or more layers of material cut from single crystal piezoelectric materials. In the foregoing, the term "piezoelectric material" also includes so-called "smart materials," sometimes created by doping known piezoelectric materials to change their electrical or mechanical properties.

The term "mechanical web" shall mean a structure comprising at least two resilient members and being adapted to translate motion to an actuating arm. Motion is translated by applying a force that causes the resilient members to flex. The resilient nature of the resilient members, however, indicates that they will return to substantially their original configuration upon removal of that force. There are a wide variety of materials that may be used to form resilient members, including, without limitation, steel, stainless steel, aluminum, carbon fiber, plastic and fiberglass.

The term "activation" when used in conjunction with "actuator" or "smart material device" means application of an electrical potential and current suitable to cause the smart material device to expand in an amount sufficient to flex the compliant members of at least one mechanical web.

The definitions and meanings of other terms herein shall be apparent from the following description, the figures, and the context in which the terms are used.

Referring now to FIG. 1, a preferred embodiment of an actuator apparatus with second stage 100 according to the present invention is illustrated. Actuator apparatus with second stage 100 comprises actuator assembly 101 and second stage assembly 150. Axis b runs through the center of actuator assembly 101 and through the center of second stage attachment surface 158. When smart material device 102 (illustrated in FIG. 5 and discussed in greater detail below) is activated, actuating arms 138 move toward second actuating arm ends 142 move toward axis b. Resilient strips 152 of second stage assembly 150 then urge second stage attachment surface 158 in a direction parallel to axis b. Where the angle α between axis a (which runs through the center of actuating arm 138) and resilient strips 152 is greater than ninety degrees, second stage attachment surface 158 is urged outward. Where the angle α is less than ninety degrees, the motion will be in the opposite direction. When smart material device 102 is no longer activated, second stage attachment surface 158 returns to substantially its original position until the next activation. The result is a smart material actuator apparatus with second stage 100 which generates motion in a direction parallel to the expansion of smart material device 102, but utilizes mechanical amplification (described further below) to generate a range of movement of second stage attachment surface 158 that is greater than the amount of actual expansion of smart material device 102. This provides an actuator with the power, speed and reliability characteristics of a traditional piezoelectric or smart material actuator, but with a greater degree of motion and a geometry that enables that motion to be parallel to the direction of expansion of the smart material device.

Figure 2A:
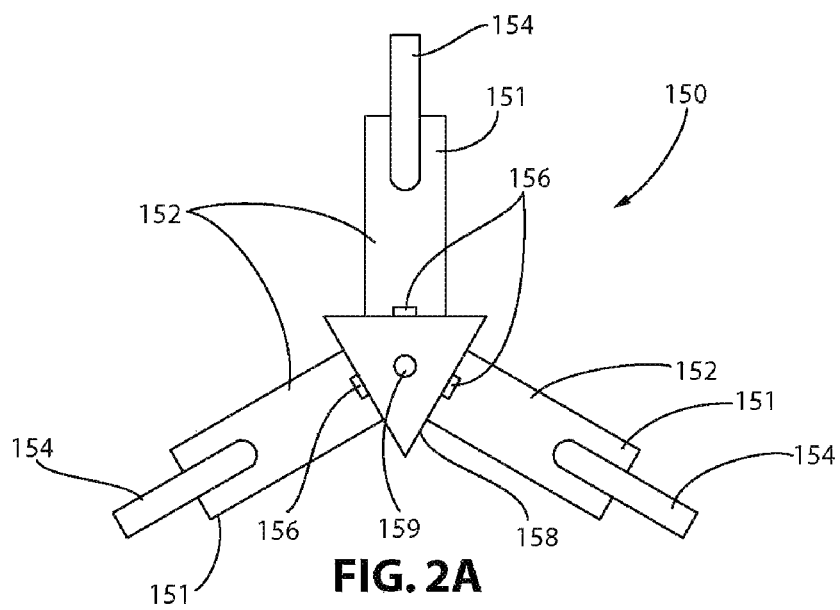
FIG. 2A is a front view of the second stage assembly embodiment illustrated in FIG. 1, having an attached mounting surface.
Figure 2B:
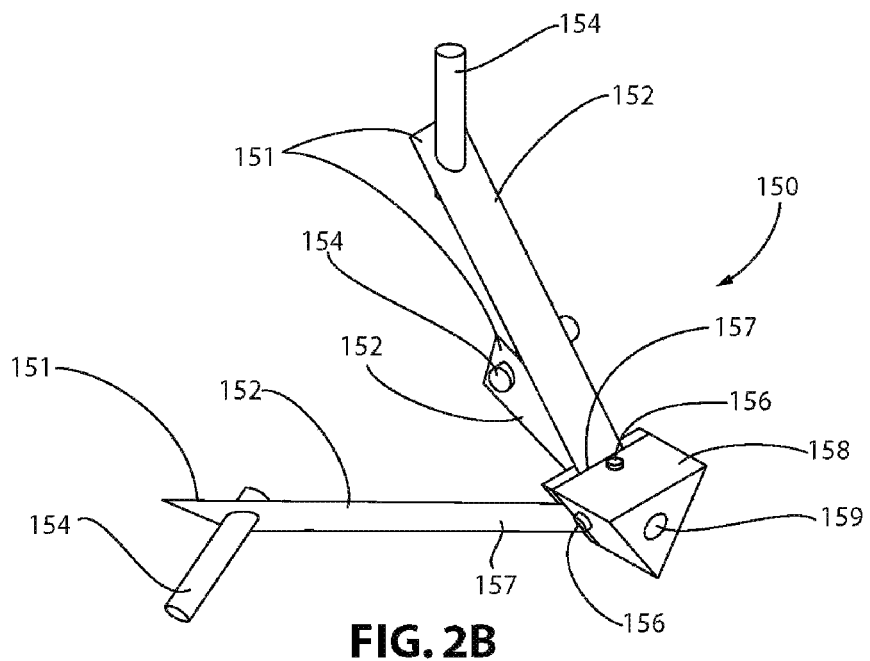
FIG. 2B is a perspective view of the second stage assembly embodiment illustrated in FIG. 2A.

Second stage assembly 150 is further illustrated in FIGS. 2A and 2B. Three resilient strips 152, which correspond to three actuating arms 138 as shown in FIG. 1, have a first resilient strip end 151 which may be attached to second actuating arm end 142. For embodiments with more than three actuating arms, additional resilient strips 152 could be added such that there is one resilient strip per actuating arm. Attachment may be accomplished by a variety of means known in the art, including (without limitation), mechanical fasteners such as bolts or screws (not illustrated), adhesives (not illustrated), welding (not illustrated), or making resilient strips 152 integral to actuating arms 138. Second stage arm pins 154 may conveniently extend through actuating arms 138 and first resilient strip end 151, thereby securing the connection. Second stage mounting means 158 may be used to further facilitate a connection. In this case second stage mounting means 158 comprise an angled slot in second actuating arm end 142 adapted such that second stage arm pins may pass though first resilient strip end 151 and at least a portion of second actuating arm end 142. Press fitting second stage arm pins 154 into actuating arms 138 can secure the connection. Welding, adhesives, or threaded fasteners (not illustrated), however, could also be used to achieve a similar result. Where press fitting is used, second stage arm pins 154 may conveniently be formed of steel, stainless steel, or aluminum. Actuating arms 138 may be formed of those same materials or of carbon fiber or plastic where a lower mass arm is desirable (as is described further in the incorporated references).

Resilient strips 152 are formed of a resilient material such as spring steel, stainless steel, aluminum, fiberglass, plastic, or carbon fiber, and operatively connect actuating arms 138 to second stage attachment surface 158. Second stage attachment surface 158 provides a structure to which a device to be actuated (not illustrated) such as a valve or diaphragm may be attached. In certain preferred embodiments, second stage attachment surface 158 may also be formed of materials such as steel, stainless steel, aluminum, fiberglass, plastic, or carbon fiber. In applications where fast activation and deactivation are desirable, light materials such as carbon fiber help reduce the mass of second stage attachment surface 158. In applications where mass is less of a concern, other potentially less expensive materials may be used. One combination that is known to work well in various applications includes actuating arms 138 being formed of steel, resilient strips 152 being formed of spring steel, and second stage attachment surface 158 being formed of carbon fiber, aluminum or steel.

As illustrated, second stage attachment surface 158 is removably attached to resilient strips 152. As illustrated, press fit block pins 156 (which may conveniently be steel or aluminum pins), pass through the block that forms second stage attachment surface 158 and resilient strips 152, thereby forming a secure connection. While not necessarily required, including angled slots in second stage attachment surface 158 allow a secure connection and help maintain the desired angular relationship between resilient strips 152 and actuating arms 138. As will be well understood by those of skill in the art, other means of attaching second stage attachment surface 158, including without limitation adhesives, welding and other types of mechanical fasteners (not illustrated), may also be used.

Mounting means 159 provides a means to operatively connect second stage attachment surface 158 to an object to be actuated (for example, and without limitation, a valve stem). As illustrated, mounting means 159 comprises a hole adapted to facilitate a mechanical connection. Many other means, however, may also be used including, without limitation, forming second stage attachment surface with a pin or other protrusion (not illustrated), or providing a surface adapted to receive an adhesive (not illustrated).

Figure 3A:
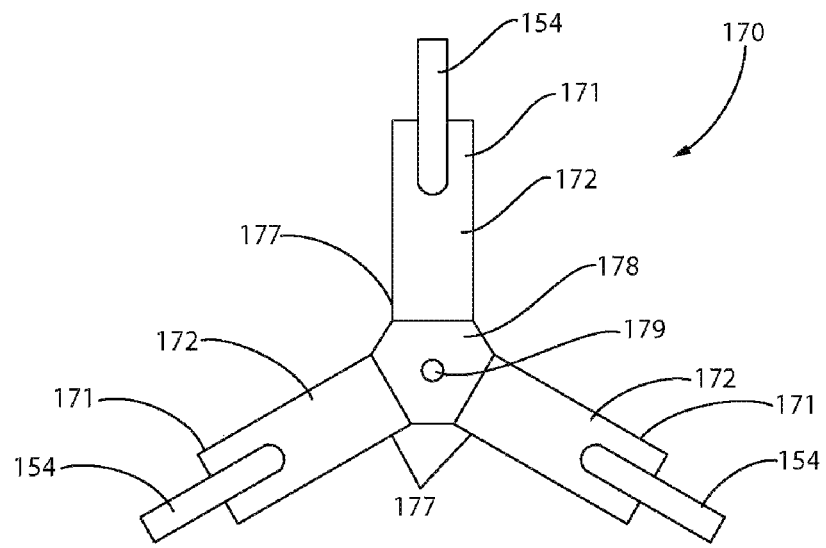
FIG. 3A is a front view of an embodiment of a second stage assembly suitable for use with actuator embodiments having three actuating arms and having an integral second stage attachment surface.
Figure 3B:
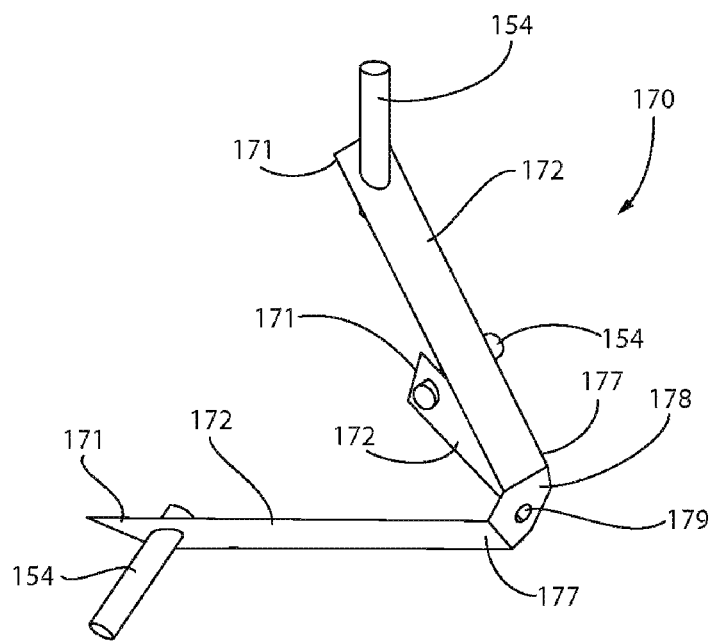
FIG. 3B is a perspective view of the second stage assembly embodiment illustrated in FIG. 3A.

FIGS. 3A and 3B illustrate an alternate embodiment second stage assembly 170, which could also be utilized with actuator assembly 101. In this embodiment, resilient strips 172 are integral with second stage attachment surface 178. This can conveniently be accomplished by stamping or forming the resilient strips 172 and second stage attachment surface 178 from a single piece of material, such as spring steel, and pre-bending resilient strips 172 to the desired angle α (see FIG. 1). Second stage attachment means 179, which may conveniently be a mounting hole in such embodiments, may then be added. Alternatively, other attachment means such as those discussed above in connection with second stage attachment means 159 may also be used. As illustrated, the same second stage arm pins 154 may be used to attach resilient strips 172 to second actuating arm ends 142, as was previously discussed. This creates a removable attachment as second stage arm pins 154 can be removed and a new second sage assembly 150 or 170 may then be added. This is convenient when the materials used for resilient strips 152, 172 break or begin to lose their resilient properties over time, as it allows for replacement of the second stage assembly 150, 170 without requiring replacement of actuator assembly 101.

Figure 4A:
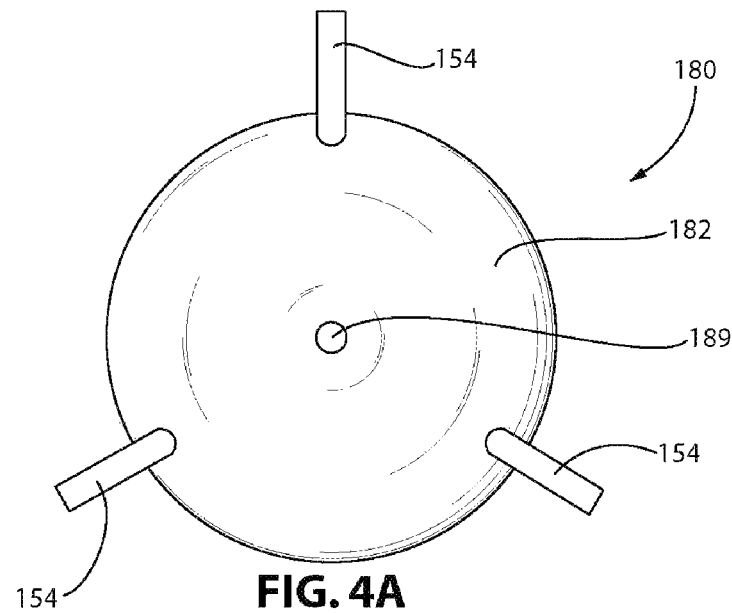
FIG. 4A is a front view of an embodiment of a second stage assembly suitable for use with actuator embodiments having three actuating arms and having a substantially semispherical convex member.
Figure 4B:
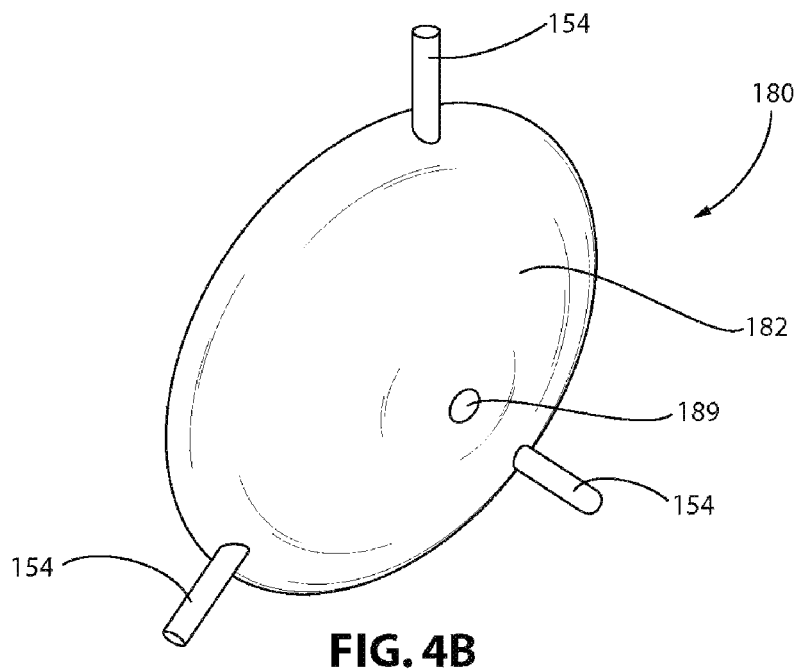
FIG. 4B is a perspective view of the second stage assembly embodiment illustrated in FIG. 4A.

FIGS. 4A and 4B illustrate a further alternate embodiment second stage assembly 180, which could also be utilized with actuator assembly 101. A resilient convex member 182 is utilized instead of resilient strips 152, 172. Second stage attachment means 189, which may again conveniently be a mounting hole in such embodiments, may be formed proximate to the geometric center of resilient convex member 182. Alternatively, other attachment means such as those discussed above in connection with second stage attachment means 159 and 179 may also be used. As illustrated, the same second stage arm pins 154 may again be used to removably attach resilient convex member 182 to second actuating arm ends 142, as was previously discussed, again creating a removable attachment as second stage arm pins 154 can be removed and a new second sage assembly 180 may then be added. Resilient convex member may be any suitable convex shape such substantially simultaneous that inward motion of second actuating arm ends 142 will cause second stage attachment means 189 to move outward. As illustrated, a substantially semispherical shape is one convenient embodiment. Web-shapes and semi-pyramidal shapes will also work, as will any of a variety of other three dimensional convex shapes. Resilient convex member 182 may also be formed of a variety of materials including, without limitation, material selected from the group of spring steel, carbon fiber, fiberglass, plastic, stainless steel and aluminum. More rigid materials such as steel, aluminum and stainless steel are not preferred unless stamped from very thin material due to the force required to flex such materials, although such materials can be used with sufficiently powerful actuating assemblies 101 in applications in which longevity requirements for resilient convex member 182 favor the use of such materials.

Figure 5:
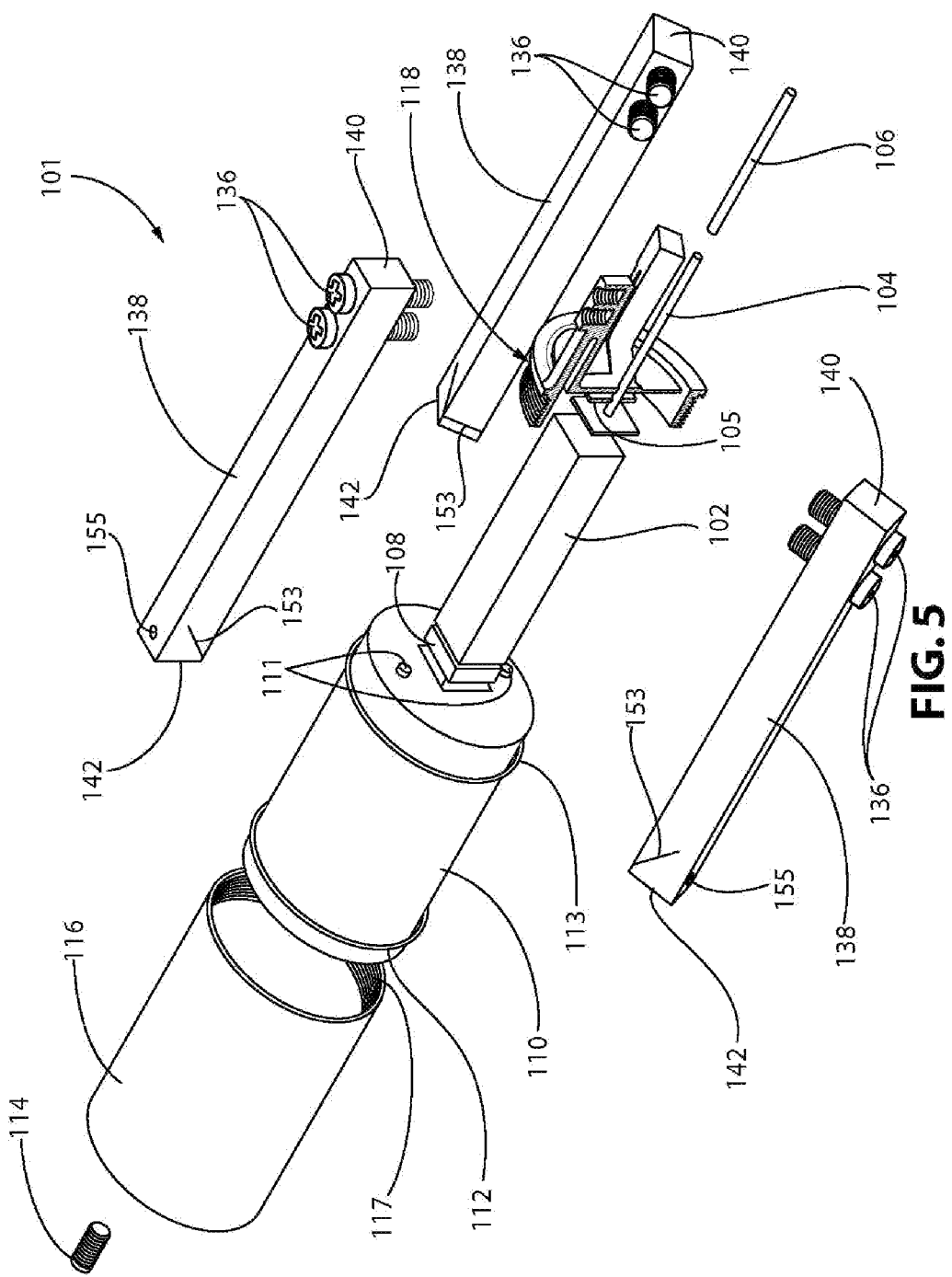
FIG. 5 is an exploded, perspective view of an embodiment of an actuator assembly having a preload screw and being suitable for use in the preferred embodiment illustrated in FIG. 1, with second stage assembly removed.
Figure 6:
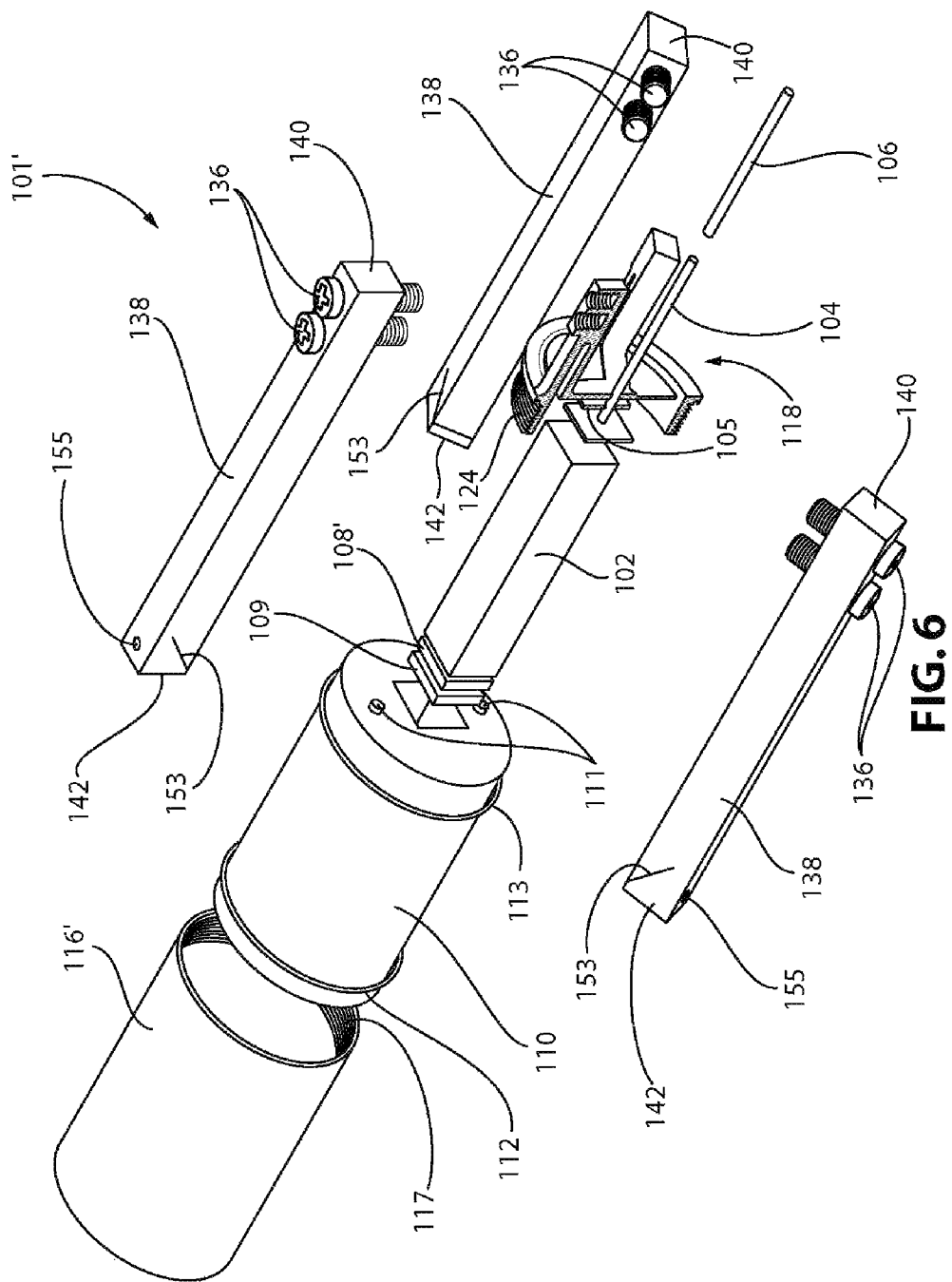
FIG. 6 is an exploded, perspective view of an alternate embodiment of an actuator assembly in which preload may be applied by the compensator without a preload screw, and also being suitable for use in the preferred embodiment illustrated in FIG. 1, with second stage assembly removed.

FIGS. 5 and 6 illustrate preferred embodiments of actuator assemblies 101 and 101' each having three actuating arms 138. Beginning with FIG. 5, actuator assembly 101 comprises a smart material device 102, a compensator 116, mechanical webs 118, and three actuating arms 138. As will be discussed below, embodiments with more than three actuating arms 138 are also possible.

Mechanical webs 118 which are further illustrated in FIGS. 7A and 7B and discussed more fully below, comprise first mounting surface 121 and are adapted to attach to compensator 116. When actuator assembly 101 is assembled, smart material device 102 is affixed between first mounting surface 121 and compensator 116. While not required, a compression spacer 108 may optionally be used between the outer end of compensator 116 and smart material device 102.

Smart material device 102 may be a stack of piezo-electric, or other smart material, or may be a single piezoelectric crystal. A key feature of smart material device 102 is that it will change shape, and in particular will expand to increased length, upon application of a suitable electric potential. While the size and particular smart material used may vary according to application, smart material devices from manufacturers including NEC-Tokin (including without limitation part numbers AE0707D43H33, and AE0505D44), EPCOS (including without limitation part numbers LN04/8534, LN04/8671, LN04/8672) Ceramtec, and Kyocera are suitable for embodiments of actuator assemblies of the present invention.

As illustrated, smart material device 102 is situated between first mounting surface 121 of mechanical webs 118, and compensator 116. Mechanical webs 118 may be formed from a variety of materials including, without limitation stainless steel, steel, aluminum, ceramics or carbon fiber. Where a conductive material is used, it is desirable to include electrode 104 and first insulator 105 between smart material device 102 and movable first mounting surface 121 of mechanical webs 118. Electrode 104 may conveniently pass through mechanical webs 118 at electrode pass through 123, thereby making it accessible for electrical connection when actuator assembly 101 is assembled. Second insulator 106 is in the form of a tube or casing and preferably provides further electrical insulation, at least at pass through 123. Because smart material device 102 expands and contracts according to the application of an electric potential, it is desirable that first insulator 105 be formed of a rigid material, which may conveniently be a ceramic material, varieties of which are known to those of skill in the art. In this way, the expansion and contraction of smart material device 102 will be more fully imparted to mechanical webs 118 with less loss due to the compression and expansion of first insulator 105. Because first mounting surface 121 may move upon expansion and contraction of smart material device 102, it is also desirable that, where a tight tolerance is used between electrode 104 and movable electrode pass through 123, second insulator 106 comprises a low-friction material such as Teflon that will reduce friction and heat as first mounting surface 121 moves, while still providing electrical insulation to avoid short circuits where mechanical webs 118 are connected to a ground, most often through compensator 116, but also possible through actuating arms 138.

In this way, electrode 104 can provide a positive electrical connection to smart material device 102 and the corresponding negative connection can be provided through the body of actuator assembly 101. It will be understood by those of skill in the art, that the foregoing describes only one possible arrangement of positive and negative electrodes and that many other arrangements are possible depending on the location of the terminals on smart material device 102 and wired connections (not illustrated) between side terminals (not illustrated) on smart material device 102, running through compensator 116 or through mechanical webs 118.

As is noted above, smart material device 102 is affixed between first mounting surface 121 and compensator 116, possibly with compression spacer 108 between compensator 116 and smart material device 102. It is desirable that smart material device 102 be affixed between opposed and substantially parallel surfaces, as such an arrangement allows smart material device 102 to be compressed, without generating significant angular forces on smart material device 102. Preventing angular movement of smart material device 102 is helpful in increasing the operational life of smart material device 102, as twisting or angular forces can lead to fractures within smart material device 102. Additionally, pre-compressing, or "preloading" smart material device 102 has been found helpful in increasing the efficiency of smart material device 102 and, in turn, actuator apparatus 101. As illustrated in FIG. 5, one means of providing such a pre-load is through preload screw 114, which engages compression spacer 108. Tightening preload screw 114 increases preload, while loosening preload screw 114 reduces preload. Compression spacer 108, which is suitably formed of a substantially rigid material such as ceramics or steel, assists in distributing the force from preload screw 114 and also assists in preventing twisting forces from being applied to smart material device 102.

An alternate means of preloading smart material device 102 is illustrated in FIG. 6, in which actuator assembly 101' utilizes compensator 116', but does not utilize a preload screw. Instead, compensator 116' has compensator threads 117 adapted to engage mechanical webs assembly threads 124. Tightening compensator 116' onto mechanical webs 118 thus provides the desired compression of smart material device 102. It will be understood by those of skill in the art that other means of attaching compensator 116' to mechanical webs 118, some of which are described in the incorporated references, may also be used and that some such arrangements also allow preloading of smart material device 102 without the use a preload screw.

Where compensator threads 117 and mechanical webs assembly threads 124 are utilized, compensator 116 (or 116') is attached with a turning or screwing motion. As it is desirable that smart material device 102 align properly and not twist, it is desirable in such embodiments to include at least one, and optionally two compression spacers 108', 109 adapted to allow compensator 116,116' to turn and compress smart material device 102 without twisting it. By forming compression spacers 108', 109 from materials with low coefficients of friction, one may turn against the other without requiring smart material device 102 to twist at the same time. Additionally, in such embodiments, first mounting surface 121 of mechanical webs 118 may comprise means to prevent smart material device 102 from twisting upon assembly. One such means to prevent twisting comprises indentations in the form of securing pin receivers 122 in second mounting surface 121 adapted to receive securing pins 111 incorporated into potting material 110. As potting material 110 preferably tightly encapsulates smart material device 102, preventing rotation of potting material 110 can, in turn, act to prevent rotation of smart material device 102. Other means to prevent rotation of smart material device 102 may also be used including, without limitation, adhesives (not illustrated), forming an indentation (not illustrated) on first mounting surface 121 adapted to receive square or rectangular embodiments of smart material device 102, forming protrusions (not illustrated) in first mounting surface 121 adapted to be received by indentations (not illustrated) in potting material 110, and forming surfaces (not illustrated) on first mounting surface 121 adapted to engage one or more surfaces on smart material device 102 and, thereby, resist rotation. Other appropriate means of preventing rotation will be apparent to those of skill in the art in light of this description.

In this manner, smart material device 102, compensator 116, compensator threads 117, mechanical web assembly threads 124, compression spacer 108 (or in the case of actuator assembly 101' compression spacers 108' and 109), and first mounting surface 121 may be adapted such that when actuator assembly 101, 101' is assembled, smart material device 102 is compressed between first mounting surface 121 and compensator 116,116'.

In certain environments, it is desirable that smart material device 102 be protected from environmental contaminants. This may preferably be accomplished by including potting material 110 contained in compensator 116, 116' which is preferably substantially in the form of a canister. The potting material 110, several examples of which are known to those of skill in the art, will preferably substantially fill the space between compensator 116, 116' and smart material device 102. O rings 112, 113 may act to help position potting material 110 within compensator 116, 116'. In certain embodiments, O ring 113 may also assist in forming a tight seal between compensator 116, 116' and mechanical webs 118. In this way, compensator 116, 116', mechanical webs 118, and potting material 110 may be adapted such that, upon assembly, smart material device 102 is substantially sealed and substantially protected from external humidity, moisture and contamination. As is discussed further below, it will be noted that mechanical webs 118 include a gap between first resilient members 126 and second resilient members 128. For improved protection, it is preferred that potting material 110 be adapted to cover such gap.

Figure 7A:
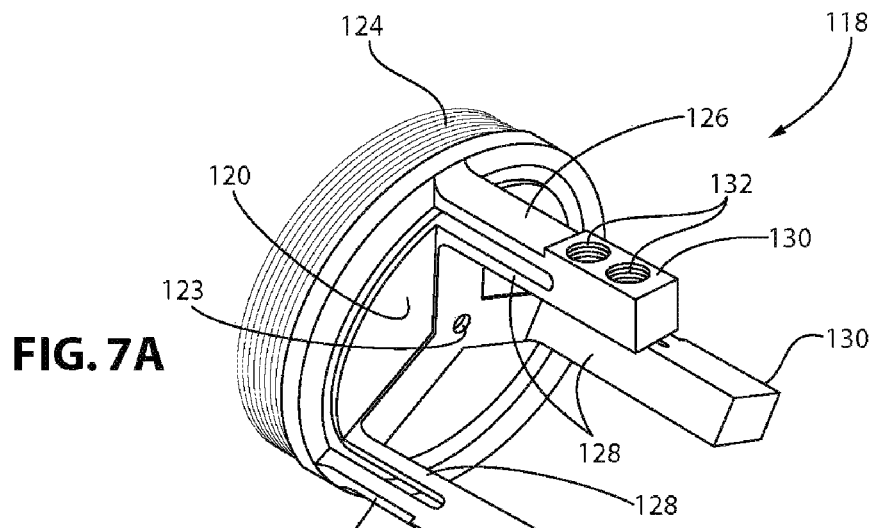
FIGS. 7A and 7B are perspective views of an embodiment of a mechanical web assembly suitable for use with the actuator assembly embodiments illustrated in FIGS. 5 and 6.
Figure 7B:
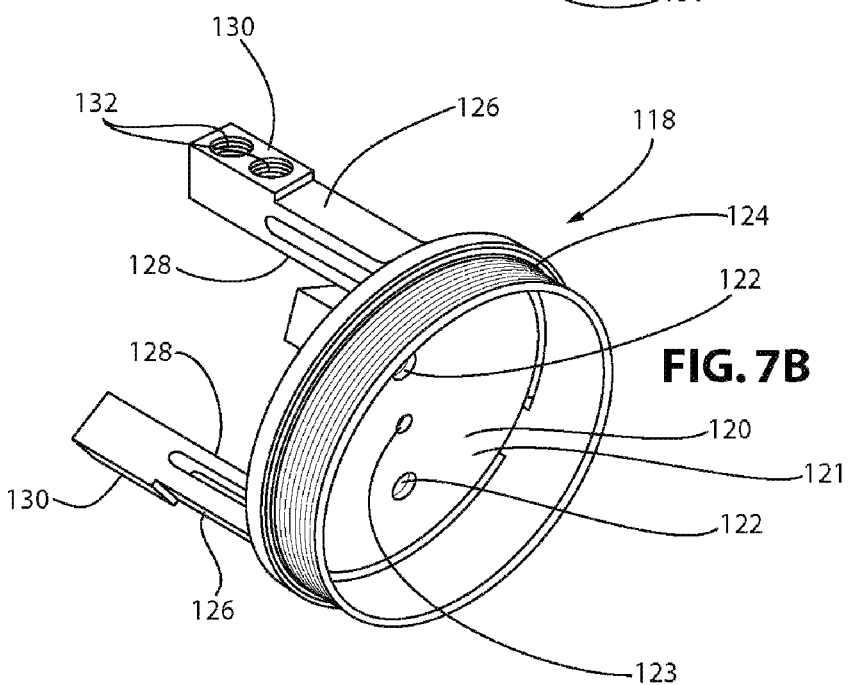

As shown in FIGS. 7A and 7B, mechanical webs 118 comprise a first resilient member 126 attached to compensator 116, 116' through mechanical web assembly threads 124, and a second resilient member 128 attached to movable supporting member 120, which incorporates first mounting surface 121. Mechanical webs 118 are adapted to flex upon movement of movable supporting member 120 and may conveniently be formed of a variety of resilient materials including, without limitation spring steel, steel, titanium, stainless steel, aluminum, or carbon fiber. The thickness and length of first resilient members 126 and second resilient members 128 will vary depending on the application for which actuator assembly 101 is adapted. For example, where greater stroke length (meaning actuating arms 138 are required to move a greater distance) is needed, thinner and longer resilient members 126 and 128 are preferred, as thinner, longer resilient members 126 and 128 result in a higher overall motion of the actuating arms 138. Where less stroke length is needed, but greater force is desired, shorter resilient members 126 and 128 may be used.

It is through the flexing of first resilient member 126 and second resilient member 128 that energy is transferred to and from smart material device 102. In particular, application of an electrical potential will cause smart material device 102 to expand, preferably substantially without angular movement. That expansion thereby urges movable supporting member 120 away from first mounting surface compensator 116, 116' and causes first resilient members 126 and second resilient members 128 to flex. Flexing occurs because first resilient members 126 are attached to compensator 116, 116' as smart material device 102 expands and, the gap between first resilient members 126 and second resilient members 128 allows movable supporting member 120 to move. The resulting flexing of resilient members 126, 128 moves actuating arms 138, and, in particular causes second actuating arm end 142 to move across a distance greater than the expansion smart material device 102. In this way, mechanical webs 118 and actuating arms 138 act as a mechanical amplifier, translating a relatively modest expansion of smart material device 102 into a greater degree of motion at second actuating arm ends 142.

In most applications, it is preferred that actuating arms 138 are each of substantially the same length and that the spacing of corresponding sets of first resilient member 126 and second resilient member 128 around movable supporting member 120 is substantially even. In this way, actuating arms 138 are spaced evenly and radially about smart material device 102 in a substantially cylindrical configuration and mechanical webs 118 are adapted such that substantially upon flexing of resilient members 126, 128 second actuating arm ends 142 move toward smart material device 102. It will be understood that the term cylindrical configuration is intended herein to include both cylindrical configurations in which actuating arms 138 are in parallel with smart material device 102 and conical configurations in which actuating arms 138 are at an angle with respect to smart material device 102, as is discussed further below. By adapting actuating arms 138 to be of a consistent length, and substantially evenly spaced around movable supporting member 120, the operational life of smart material device 102 may be improved as each actuating arm 138 and its corresponding sets of first resilient member 126 and second resilient member 128 will typically move evenly, thereby reducing the likelihood of twisting or deflecting smart material device 102, which may become more likely if one actuating arm 138 is subjected to substantially different levels of stress than are other actuating arms 138.

Actuating arms 138 are preferably attached to mechanical webs 118 at first actuating arm end 140. Any variety of attachment means will be readily apparent to those of skill in the art in light of this description, including, without limitation, press-fitting, welding, use of adhesives or epoxies, or forming actuating arms 138 integral to mechanical webs 118. One convenient means of removably attaching actuating arms 138 to mechanical webs 118 is illustrated in the figures and comprises the use of mechanical fasteners 136 passing through actuating arms 138 and into threaded receptacles 132. An advantage of actuating arms 138 being removably attached is that it allows for use of actuating arms 138 in different lengths and of different materials than mechanical webs 118, thereby making it easier to adapt a given actuator assembly 101, 101' to different uses. While a variety of materials may be utilized for actuating arms 138, carbon fiber, stainless steel, steel, aluminum, ceramic and rigid plastics are may all be suitable choices depending on the application. Carbon fiber has been found to be particularly suitable where a high-strength, light-weight actuating arm 138 is needed. Light-weight actuating arms 138 are particularly desirable when high speed actuators are needed as lowering the weight of the actuating arm 138 tends to increase the resonant frequency of actuator assembly 101, 101'.

Figure 8:
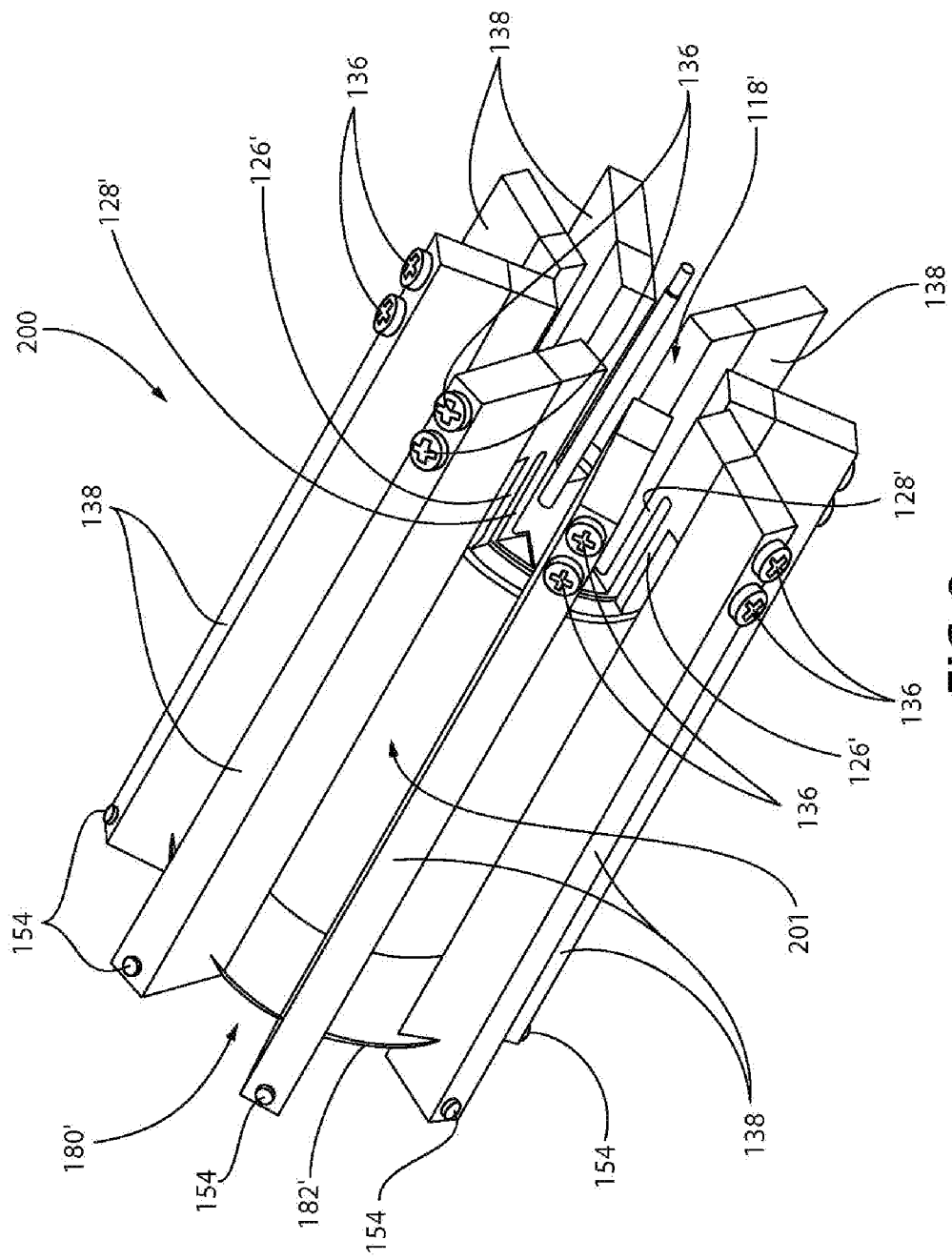
FIG. 8 is a perspective view of a preferred embodiment of the actuator assembly of the apparatus of the present invention having eight actuating arms and a second stage assembly comprising a substantially semispherical convex element.

The embodiments illustrated in FIGS. 1, 5, and 6 have three removably attached actuating arms 138. The present invention, however, is not limited to three arm embodiments. Alternate embodiments of the actuator of the present invention may include three or more actuating arms 138 and actuating arms of other configurations. FIG. 8 illustrates one such embodiment, in which the actuator apparatus with second stage 200 comprises actuator assembly 201 having eight actuating arms 138 and second stage assembly 180 having resilient convex member 182'. As has been previously described, second stage assembly 180 may be removably attached to actuating arms 138 through actuating arm pins 154. As illustrated, actuator assembly 201 has mechanical webs 118', having eight sets of first resilient members 126' and second resilient members 128', each connected to an actuating arm 138, which may suitably be accomplished with arm fasteners 136 (in this case threaded fasteners, preferably of steel). As actuator apparatus with second stage 200 is activated, actuating arms 138 move inward, thereby causing the central point of resilient convex member 182' to move outward. Having a greater number of actuating arms 138 distributed around resilient convex member 182' helps distribute the force more evenly around the perimeter of resilient convex member 182', which can be desirable when greater force is required at the center of resilient convex member 182', as it helps in resisting deformation of the shape of resilient convex member 182'.

Figure 9:
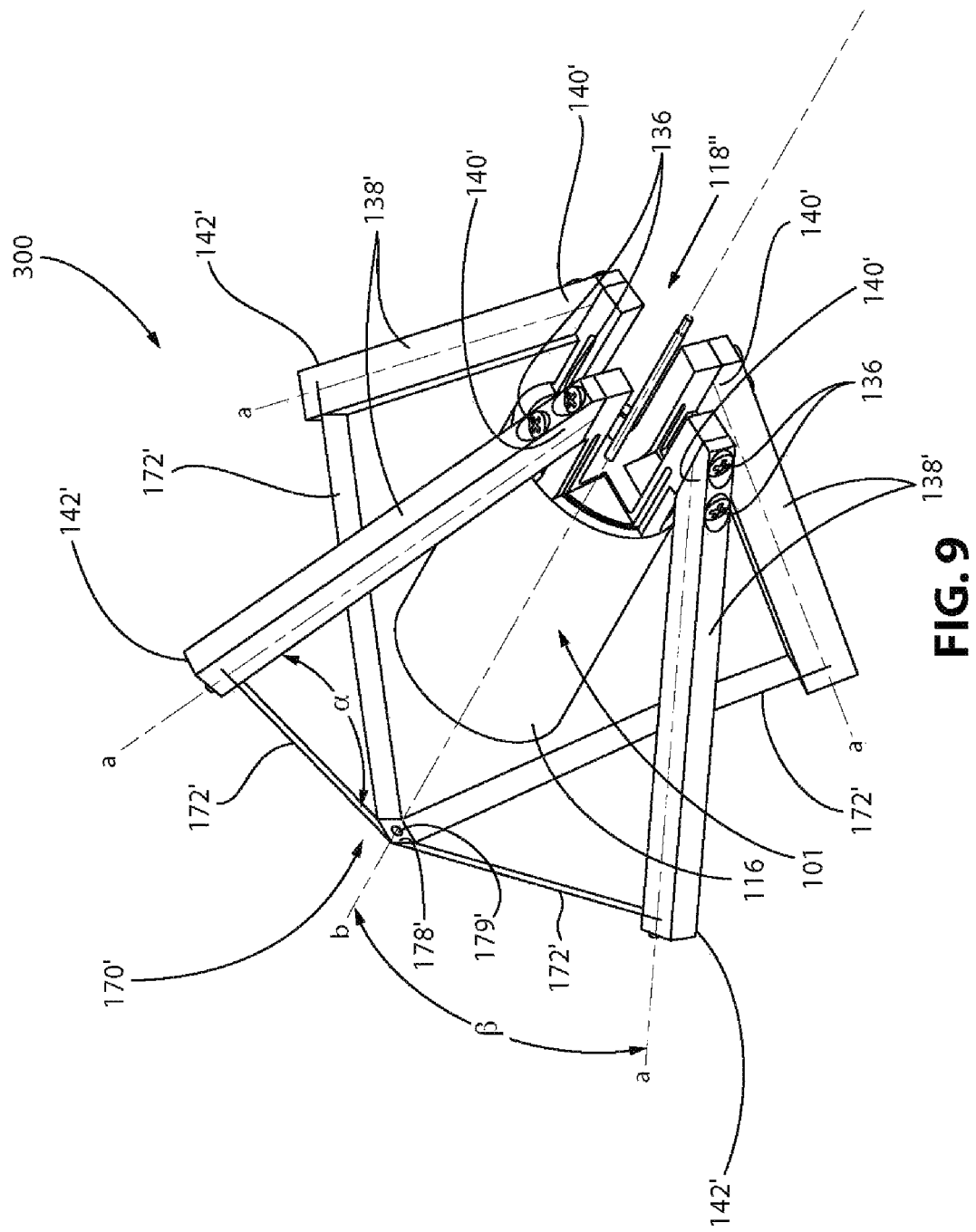
FIG. 9 is a perspective view of a preferred embodiment of the actuator assembly of the apparatus of the present invention having four actuating arms oriented at an angle of approximately forty-five degrees, and a second stage assembly comprising an integral second stage attachment surface.

FIG. 9 illustrates an embodiment of an actuator apparatus with second stage 300, having four actuating arms 138' extending at an angle $\beta$ of approximately 45 degrees. Second stage assembly 170' is formed of a single piece of material, which may conveniently be carbon fiber or spring steel, such that second stage attachment surface 178' integral to second stage assembly 170', and is operably connected to second actuating arm ends 142'.

First actuating arm ends 140' are angled where they attach to mechanical webs 118". For each actuating arm 138', axis a extends through first actuating arm end 140' and second actuating arm end 142', substantially through the center of actuating arm 138' as illustrated. Each first actuating arm end 140' is angled such that the angle $\beta$ between central axis b and each arm axis a is approximately forty-five degrees. Where second stage assembly 170' is proximate to compensator 116, angles $\beta$ may conveniently range from zero degrees (in which case actuating arms 138' are substantially parallel to central axis b), to ninety degrees, in which case actuating arms 138' are nearly perpendicular to central axis b). In this way, by varying angle β and the corresponding angle α (which extends between arm axis a and resilient strip 172'), it is possible to vary the stroke length and force applied by actuator apparatus with second stage 300. While angles β of zero, or between at least forty-five degrees and at most ninety degrees, have been found to be convenient for common applications, any angle between zero degrees and ninety degrees may be used. In each such embodiment second stage attachment surface 178' moves outward substantially upon activation of actuator assembly 101 and inward substantially upon deactivation.

Figure 10:
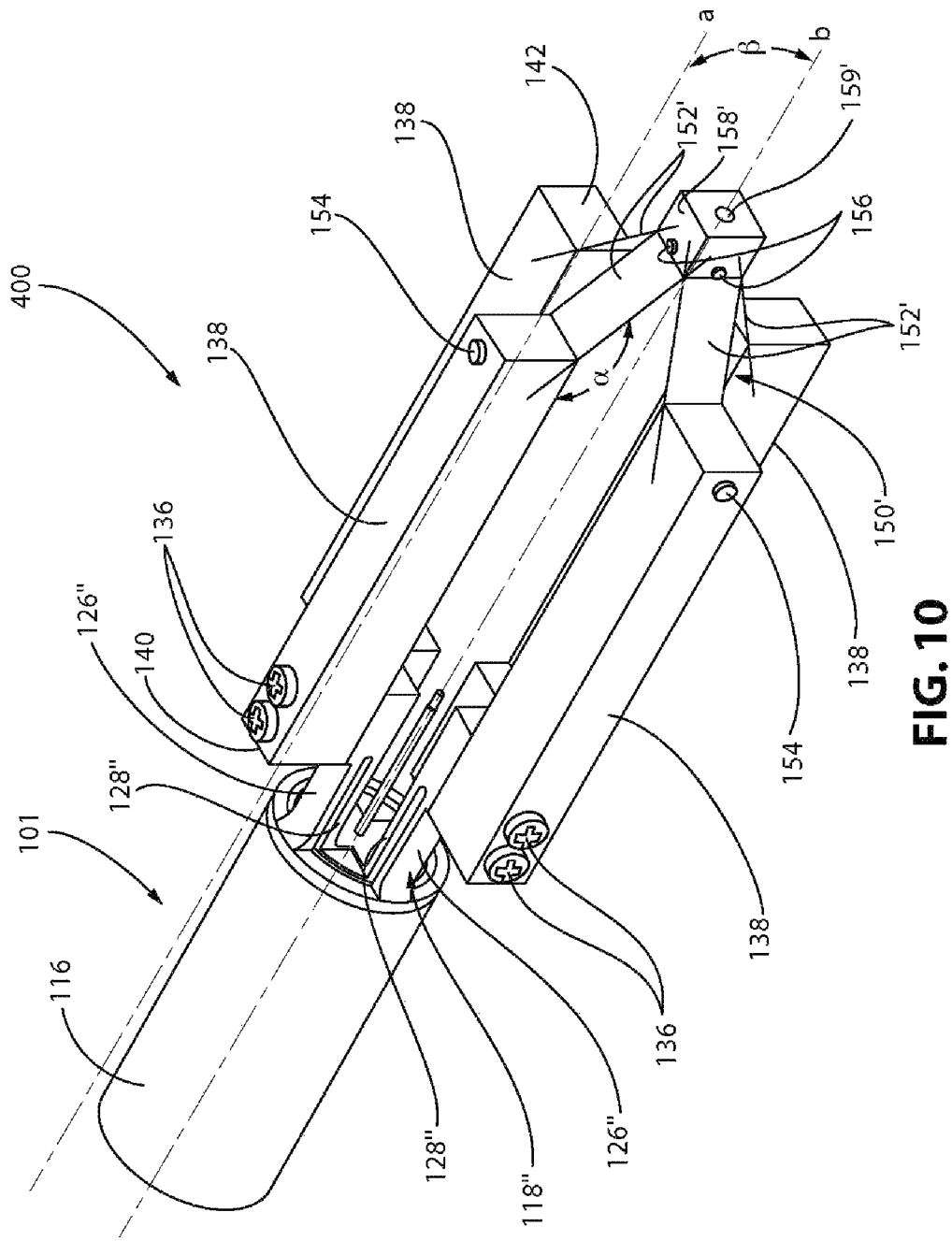
FIG. 10 is a perspective view of a preferred embodiment of the actuator assembly of the apparatus of the present invention having four actuating arms oriented at an angle of approximately one hundred eighty degrees, and a second stage assembly comprising a removably attached second stage attachment surface.

As is illustrated in FIG. 10, embodiments of the present invention may also be configured to actuate in the opposite direction. FIG. 10 illustrates an embodiment of an actuator apparatus with second stage 400, having four actuating arms 138 extending at a angle β of approximately one hundred eighty degrees. Second stage assembly 150' is formed of a resilient strips 152' (which may conveniently be formed of spring steel, carbon fiber, and other materials previously discussed) and removably attachable second stage attachment surface 158', which may also be of materials such as steel, aluminum, carbon fiber, and other materials previously discussed.

As previously described, for each actuating arm 138, axis a extends through first actuating arm end 140 and second actuating arm end 142, substantially through the center of actuating arm 138 as illustrated. As illustrated in this embodiment, first actuating arm end 140 is substantially square such that the angle β between central axis b and each arm axis a is approximately 180 degrees. In such embodiments, second stage assembly 150' extends in the opposite direction from compensator 116. Substantially upon activation of actuator assembly 101, each first resilient member 126" and second resilient member 128" of mechanical webs 118" will flex, thereby causing second actuating arm ends 142 of each of four evenly spaced actuating arms 138 to move away from each other and central axis b. This motion, in turn, causes second stage attachment surface 158' to move back toward compensator 116. Substantially upon deactivation of actuator assembly 101, first compliant members 126" and second compliant members 128" will return to their original orientation, thereby causing second stage attachment surface 158' to return to its original position.

Although not illustrated, it is readily apparent how angles β of between slightly greater than ninety degrees and less than one hundred eighty degrees can be achieved by utilizing different embodiments of actuating arms 138' (shown on FIG. 9) with different angled first actuating arm ends 140'. In such embodiments, angles β of between at least ninety-one and at most one hundred thirty-five degrees have been found suitable for common applications, as is angle β of one hundred eighty degrees.

The flexibility of embodiments of the present invention formed of interchangeable parts is apparent in the embodiments thus far described. Each of actuator apparatuses with second stage 100, 200, 300, 400 may use actuator assembly 101 or actuator assembly 101'. By varying mechanical web assemblies 118 (adapted to receive three actuating arms), 118' (adapted to receive eight actuating arms) and 118" (adapted to receive four actuating arms) the same actuator assembly 101 or 101' may be reused with actuator apparatuses having different numbers of actuating arms. Similarly, actuating arms 138 may also be reused in embodiments having different numbers of arms and in embodiments having angles β of zero degrees or one hundred eighty degrees simply by attaching them in the appropriate orientation. Where different angles β are desired, actuating arms 138' having angled first actuating arm end 140' may be substituted. Different embodiments of second stage assemblies 150, 170, 180 may then be attached. In this way, a wide number of actuator apparatuses may be constructed from a common set of parts.

Where second stage assembly 170' is proximate to compensator 116, angles β may conveniently range from zero degrees (in which case actuating arms 138' are substantially parallel to central axis b), to ninety degrees, in which case actuating arms 138' are nearly perpendicular to central axis b). In this way, by varying angle β and the corresponding angle α (which extends between arm axis a and resilient strip 172'), it is possible to vary the stroke length and force applied by actuator apparatus with second stage 300. While angles β of zero, or between at least forty-five degrees and at most ninety degrees' have been found to be convenient for common applications, any angle between zero degrees and at most slightly less than ninety degrees may be used. In each such embodiment, second stage attachment surface 178' moves outward substantially upon activation of actuator assembly 101, and inward substantially upon deactivation.

Figure 11:
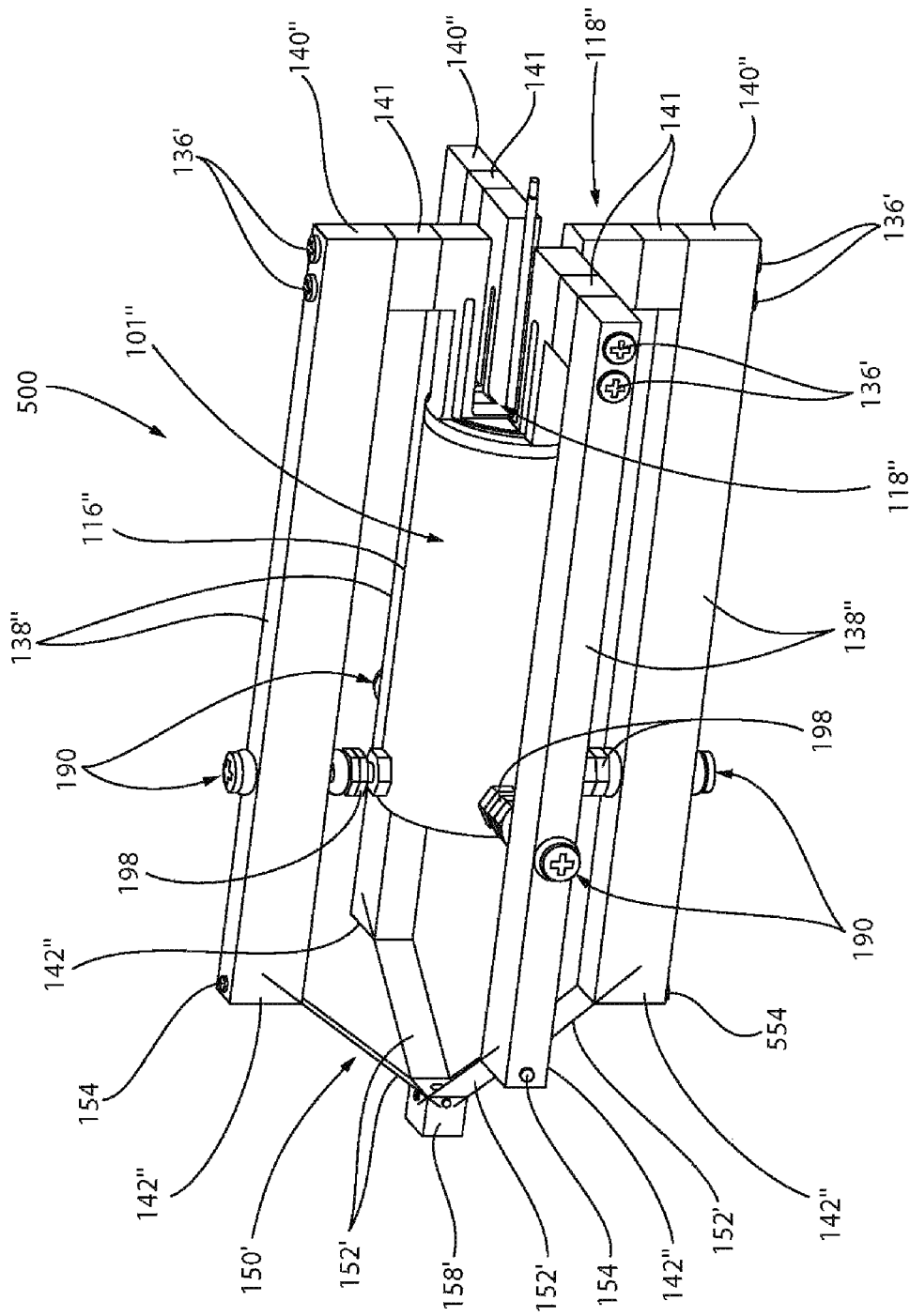
FIG. 11 is a perspective view of a preferred embodiment of the actuator assembly of the apparatus of the present invention having four actuating arms oriented at an angle of approximately zero degrees, a second stage assembly comprising a removably attached second stage attachment surface, and dampeners fixedly attached to the compensator.

As is further discussed in the incorporated references, when actuators are operated at high speeds, momentum and resonance effects can cause excessive arm movement, resulting in damage to the actuator apparatus. FIG. 11 illustrates and embodiment of actuator apparatus with second stage 500 that is adapted to be operated at a high speed without substantial risk of excessive arm movement and its attendant consequences. Actuator apparatus 101" is substantially similar to actuator apparatus 101, previously described, with the exception of compensator 116". Compensator 116" is adapted to receive one dampener 190 per actuating arm 138". Actuating arms 138" are likewise adapted such that dampeners 190 pass through actuating arms 138" prior to connecting to compensator 116".

Figure 12:
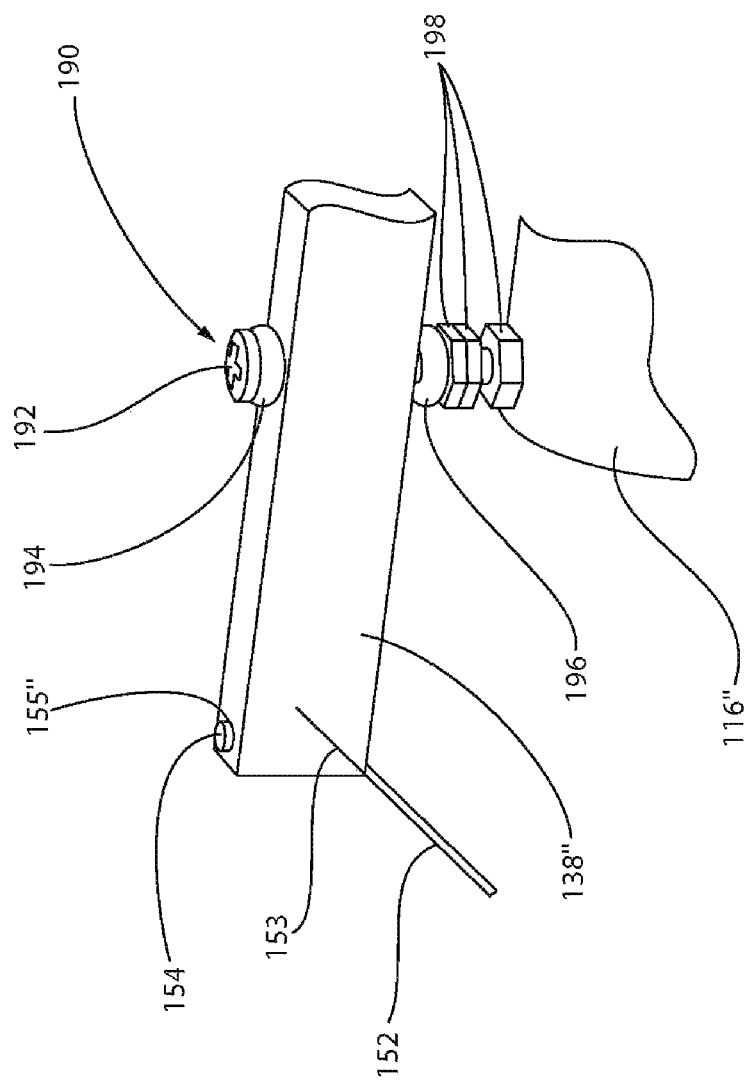
FIG. 12 is a detail perspective view of one dampener shown in the embodiment illustrated in FIG. 11.

The structure of dampeners 190 is shown in further detail on FIG. 12. Dampener fastener 192, which may conveniently be a steel or stainless steel machine screw, passes through actuating arm 138" and is received in a threaded hole (not illustrated) in compensator 116". First pliable stop 194, which may conveniently be an appropriately sized O ring or washer, formed of a pliable material such as rubber, is situated on dampener fastener 192 between actuating arm 138" and the head of dampener fastener 192. Second pliable stop, which may also be an appropriately sized O ring or washer, formed of a pliable material such as rubber, is situated on dampener fastener 192 on the other side of actuating arm 138". Three nuts 198 are utilized to secure dampeners 190 during operation. The lowermost nut 198 may be tightened against compensator 116" and serves to resist loosening of dampener fastener 192 during operation. The two upper nuts 198 are tightened against one another and serve to support second pliable stop 196 in a predetermined location. That location may be selected such that actuating arm 138" can move to its maximum intended operating limit, at which point it will contact second pliable stop 196, which (supported by nuts 198) will resist harmful or undesired overextension when actuating apparatus 101" is operated at high speeds. Similarly, first pliable stop 194 resists overextension in the opposite direction. By cinching the two upper nuts 198 against each other, second pliable stop 196 may be secured in place and movement or "creeping" of pliable stop 196 during high speed operation is resisted. Utilizing a pliable material such as rubber for first pliable stop 194 and second pliable stop 196 is desirable as such materials cushion the impact of actuating arm 138" and resist ringing. In this way, actuator apparatus with second stage 500 may be operated at high speeds without fear of causing overextension of actuating arms 138" that could cause failure, for example, by causing mechanical webs 118" to exceed their yield points. Utilizing two nuts 198 on threaded dampener fastener 192 is preferable as it allows the position of second pliable stop 196 to be adjusted, thereby enabling the same dampener 190 to be utilized in actuator assemblies having different stroke lengths. It will be understood, however, that other convenient designs for dampener 190 will be apparent to those of ordinary skill in the art in light of the foregoing description including, without limitation, utilizing threaded rod (not illustrated) or a non-threaded post for dampener fastener 192, welding dampener fastener 192 to compensator 116", and using different mechanical means of locating second pliable stop 196. It is also possible to size compensator 116" such that a pliable pad (not illustrated) may be attached directly beneath each actuating arm 138" to replace second pliable stop 196, while a ring (not illustrated) situated around the outside of actuating arms 138", also having appropriately situated pliable pads (not illustrated) could replace first pliable stops 194.

Referring to FIG. 11, it can be seen that when dampeners 190 are utilized, it can be desirable to increase the spacing between actuating arms 138" and compensator 116" in order to allow space for nuts 198 and second pliable stop 196, while still retaining a degree of adjustability in the positioning of second pliable stop 196. This may be accomplished by utilizing mechanical webs adapted to raise actuating arms 138" (not illustrated). However, while feasible, such designs require manufacture of a variety of configurations of such mechanical webs to accommodate different spacing. Greater flexibility and lower overall manufacturing cost can be achieved by utilizing actuating arm extension blocks 141. Actuating arm extension blocks 141 may be formed of steel, stainless steel, aluminum or any other suitably rigid material and serve as spacers. Longer arm fasteners 136' may then be used to secure actuating arms 138" to mechanical webs 118" through holes (not illustrated) drilled through actuating arm extension blocks 141. Because of their simplicity, it can thus be convenient to provide a variety of sizes of actuating arm extension blocks 141, each adapted to be assembled with the same mechanical webs 118" and actuating arms 138".

Figure 13:
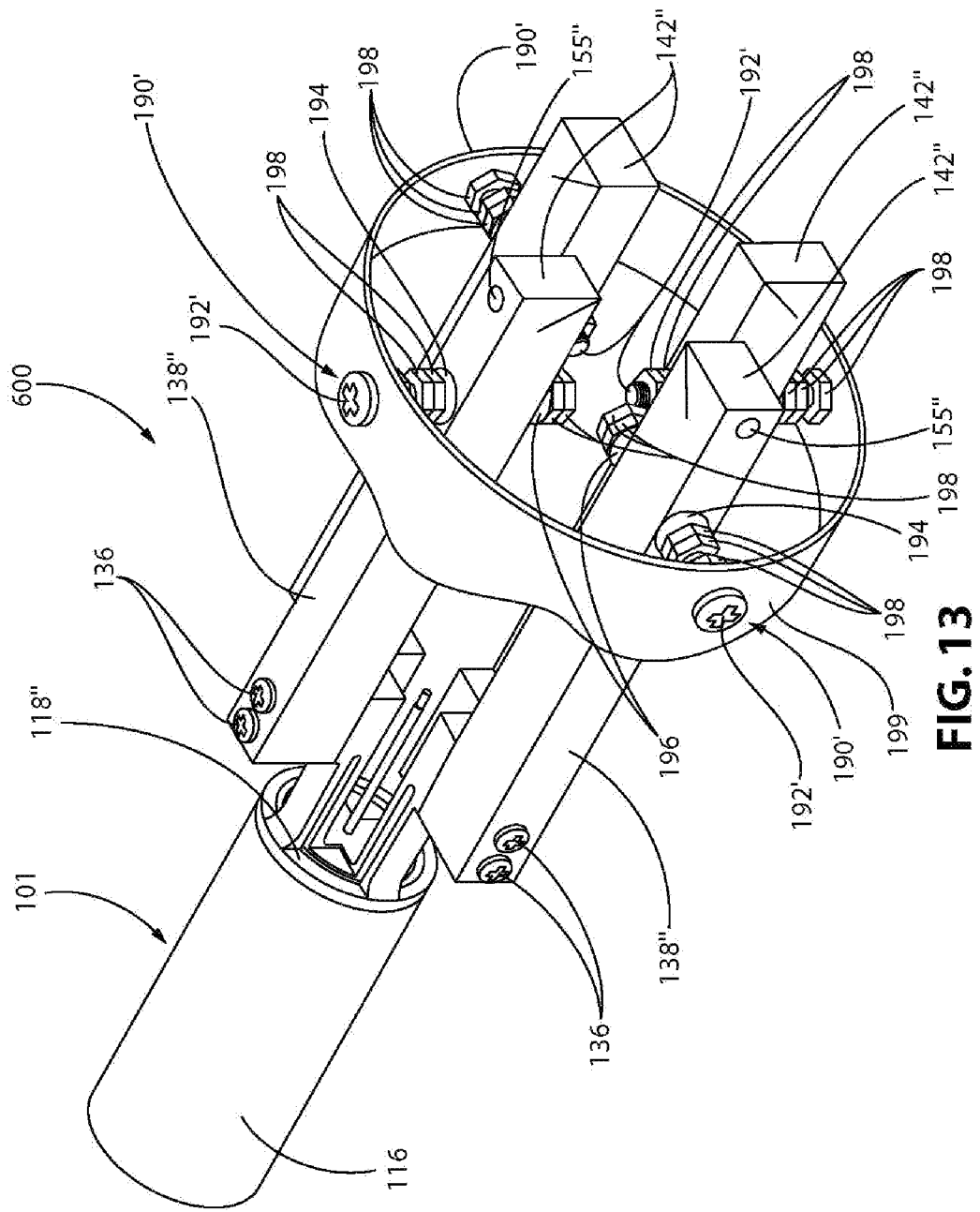
FIG. 13 is a perspective view of a preferred embodiment of the actuator assembly of the apparatus of the present invention having four actuating arms oriented at an angle of approximately one hundred eighty degrees, and dampeners fixedly attached to a surrounding yoke, with the second stage assembly removed.

FIG. 13 illustrates an alternate embodiment of dampeners 190' adapted to be utilized in embodiments in which actuating arms 138" extend away from compensator 116. In such embodiments, outer frame 199, which may conveniently be a yoke or cylindrical outer casing, surrounds actuating arms 138" leaving sufficient room for the predetermined stroke length of actuating arms 138" plus an additional space for the components of dampeners 190'. In such embodiments, dampeners 190' operate in a manner substantially similar to dampeners 190, which was previously described. Dampener fastener 192', which may conveniently be a steel or stainless steel machine screw, extends through outer frame 199 and holes (not illustrated) in actuating arms 138". First nut 198 secures dampener fastener 192' by cinching against outer frame 199. Two additional nuts 198 then serve to position first pliable stop 194. Once again, cinching together nuts 198 serves to prevent creeping during operation. Similarly, the lowest two nuts 198, also cinched together, serve to securely position second pliable stop 196. In this way, actuator assembly 600 can be operated at high speeds at or near resonance with much reduced risk of damage due to overextension. While no second stage assembly is illustrated in FIG. 13, any of the second stage assemblies previously described, including without limitation second stage assembly 150 may be used.

Referring again to FIGS. 1, 9, and 10, it will be noted that the position of second stage mounting surface 158, 158', 178' and angle α between actuating arms 138, 138' and resilient strips 152, 152', 172' will be dictated by the angles β between central axis b and actuating arms 138, 138' and the length of resilient strips 152, 152', 172'. While angles α may conveniently extend from just greater than ninety degrees to just less than one hundred eighty degrees, angles of one hundred twenty to one hundred sixty degrees may be utilized in many applications. It will be noted that the lower the angle α, the greater the degree of movement of second stage mounting surface 158, 158', 178'. At the same time, the greater angle α, the greater the force exerted, even though the degree of movement will be less. Thus, it is understood that the ultimate actuating distance and force applied by second stage mounting surface 158, 158', 178' will depend on the stroke length of actuating arms 138, 138' and angles α and β. Methods of adjusting the stroke length of actuating arms 138, 138' are described in the incorporated references. Adjustment of angles α and β can be accomplished by adjusting the lengths of resilient strips 152, 152', 172' and by adjusting the angles of actuating arms 138". Actuating arm mounting blocks 141 (illustrated on FIG. 11) of varying size provide a further means of adjusting the lengths of resilient strips 152, 152', 172' without repositioning the ultimate location of second stage mounting surface 158, 158', 178'.

As will be understood from the foregoing description, smart material driven actuating apparatuses with second stage assemblies 100, 200, 300, 400, 500, 700 according to the present invention provide for efficient, flexible actuators capable of asserting force along central axis b. The use of smart material devices and the possible use of dampeners provide for reliable, efficient, actuator apparatuses that can be operated reliably at high speeds, or even at resonant frequencies. The reuse of common parts and assemblies in different embodiments allows for the assembly of a variety of configurations from a relatively small number of common components, thus maximizing flexibility without excessive manufacturing costs. In sum, and in light of the foregoing description, the present invention may then be summarized as an actuator apparatus comprising a smart material device 102, a compensator 116, a movable supporting member 120, at least three mechanical webs (wherein mechanical webs 118 comprise sets of first resilient members 126 and second resilient members 128), at least three actuating arms 138, 138', 138", 138''', and a second stage assembly 150, 170, 180. The mechanical webs 118, 118', 118" comprise a first resilient member 126, 126', 126" attached to the compensator 116, 116' and a second resilient member 128, 128', 128" attached to the movable supporting member 120. The movable supporting member 120 comprises a first mounting surface 121 (preferably substantially centered), with mechanical webs 118 (comprising sets of first resilient members 126 and second resilient members 128) spaced (preferably evenly) around the movable supporting member 120. The smart material device 102 is affixed between the first mounting surface 121 and the compensator 116. The actuating arms 138, 138', 138", 138''' comprise a first actuating arm end 140, 140', 140" attached to one said mechanical web and an opposed second actuating arm end 142, 142', 142", 142''' attached to the second stage assembly 150, 170, 180. A preferred embodiments of the second stage assembly 150 comprises resilient strips 152 having a first resilient strip end 151 attached to said second actuating arm end 142, 142', 142", 142''' and a second resilient strip end 152 attached to a second stage attachment surface 159. Due to its piezoelectric properties, application of an electrical potential will cause the smart material device 102 to expand, thereby urging the movable supporting member 120 away from compensator 116 and causing the first and second resilient members 126, 128 to flex, thereby moving the actuating arms 138, 138', 138", 138'" and causing the resilient strips 152 to urge second stage attachment surface 158 in a direction substantially parallel to smart material device 102.

As has been discussed, different embodiments of second stage assembly are possible. Embodiments, wherein resilient strips 172 are integral with second stage attachment surface 178, are functional and inexpensive to produce. Embodiments, wherein second stage attachment surface 158 is removably attached to resilient strips 152, provide for additional flexibility as different attachment surfaces 158 can be adapted for different applications. Resilient strips 152, 172 may be formed from a variety of materials including material selected from the group consisting of spring steel, carbon fiber, fiberglass, plastic, stainless steel, and aluminum. Similarly, second stage attachment surface 158 may be formed of a material selected from the group consisting of carbon fiber, spring steel, fiberglass, plastic, stainless steel, and aluminum.

In preferred embodiments, actuating arms 138, 138', 138", 138'" will each be of substantially the same length. The spacing of the sets of resilient members 126, 128 will be substantially even such that the distance between each two adjacent resilient members 126, 128 is substantially identical. Similarly, actuating arms 138, 138', 138", 138'" will be spaced radially about smart material device 102, and mechanical webs 118 will be adapted such that substantially upon flexing of the resilient members 126, 128, second actuating arm ends 142, 142', 142" will move toward smart material device 102 in the center of compensator 116, 116'.

The angles $\beta$ of actuating arms 138, 138', 138", 138'" can allow for still further adaptability to different applications. Consider a central axis b through the center of smart material device 102 extending through the center of the first mounting surface 121 and, for each actuating arm 138, 138', 138", 138'", an actuating arm axis a extending through the actuating arm's first actuating arm end 140, 140', 140" and the second actuating arm's second actuating arm end 142, 142', 142", 142'". In certain preferred embodiments in which actuating arms 138, 138', 138", 138'" extend away from compensator 116, 116', the angle $\beta$ between the central axis b and each actuating arm axis will be one hundred eighty degrees (meaning that the central axis b and each actuating arm axis a are substantially parallel), or at least ninety-one degrees and at most one hundred thirty-five degrees. Angles $\beta$ of at least one hundred thirty degrees and no more than one hundred eighty degrees are also possible.

In other preferred embodiments, in which actuating arms 138, 138', 138", 138'" extend toward compensator 116, 116', angles $\beta$ of zero degrees (again meaning that the central axis b and each actuating axis a are substantially parallel), and angles $\beta$ of at least forty-five degrees and at most ninety degrees are suitable. Angles $\beta$ of no more than fifty degrees are also convenient for many embodiments.

While embodiments in which the actuating arms 138, 138', 138", 138'" are integral to mechanical webs 118, 118', 118' are possible and may be preferred where mass production of limited number of actuator configurations is needed, embodiments in which actuating arms 138, 138', 138", 138'" are removably attached to the mechanical webs 118, 118', 118" can have certain advantages, including allowing for having at least one mechanical web (comprising first and second resilient members 126, 128) formed of a different material than at least one actuating arm 138, 138', 138", 138'". This allows for using actuating arms 138, 138', 138", 138'" of different masses and lengths, which can assist in tuning resonant frequencies, as is discussed in the incorporated references.

Where repeated high speed operation is a possibility adding at least one dampener 190 attached to compensator 116' and movably attached to at least one actuating arm 138", said dampener 190 comprising a pliable stop 196 between at least one said actuating arm 138" and said compensator 116'. Alternatively, a dampener 190' fixedly attached to an outer frame 199 and movably attached to at least one said actuating arm 138" will also work. In either case, dampeners 190',190 comprising a pliable stop 196 between the actuating arm 138" and the outer frame 199 or adjacent to the compensator 116, 116', can serve to prevent over extension of the mechanical webs 118, 118', 118" during high speed operation.

Alternatively, a second stage assembly 180 comprising resilient convex member 182 attached to the second actuating arm ends 142, 142', 142", 142'" can also be used. In such embodiments, application of an electrical potential causes smart material device 102 to expand, thereby urging the movable supporting member 120 away from said compensator 116, 116' and causing sets of first and second resilient members 126, 128 to flex, thereby moving the actuating arms 138, 138', 138", 138'" and causing a central point of the resilient convex member 182 to move in a direction substantially parallel to the smart material device 102. Just as with other embodiments of second stage assembly discussed, the resilient convex member 182 may be removably attached to the second actuating arm ends, thereby allowing for replacement and interchangeability. The resilient convex member 182 may conveniently be formed of a material selected from the group consisting of spring steel, carbon fiber, fiberglass, plastic, stainless steel, and aluminum, and may conveniently be substantially semispherical in shape. In such embodiments, at least one dampener 190 attached to the compensator 116' and movably attached to at least one said actuating arm 138" may also be utilized wherein the dampener comprises a pliable stop 196 between the actuating arm 138" and the compensator to act as a resilient pad that resists overextension of the mechanical webs 118".

Figure 14:
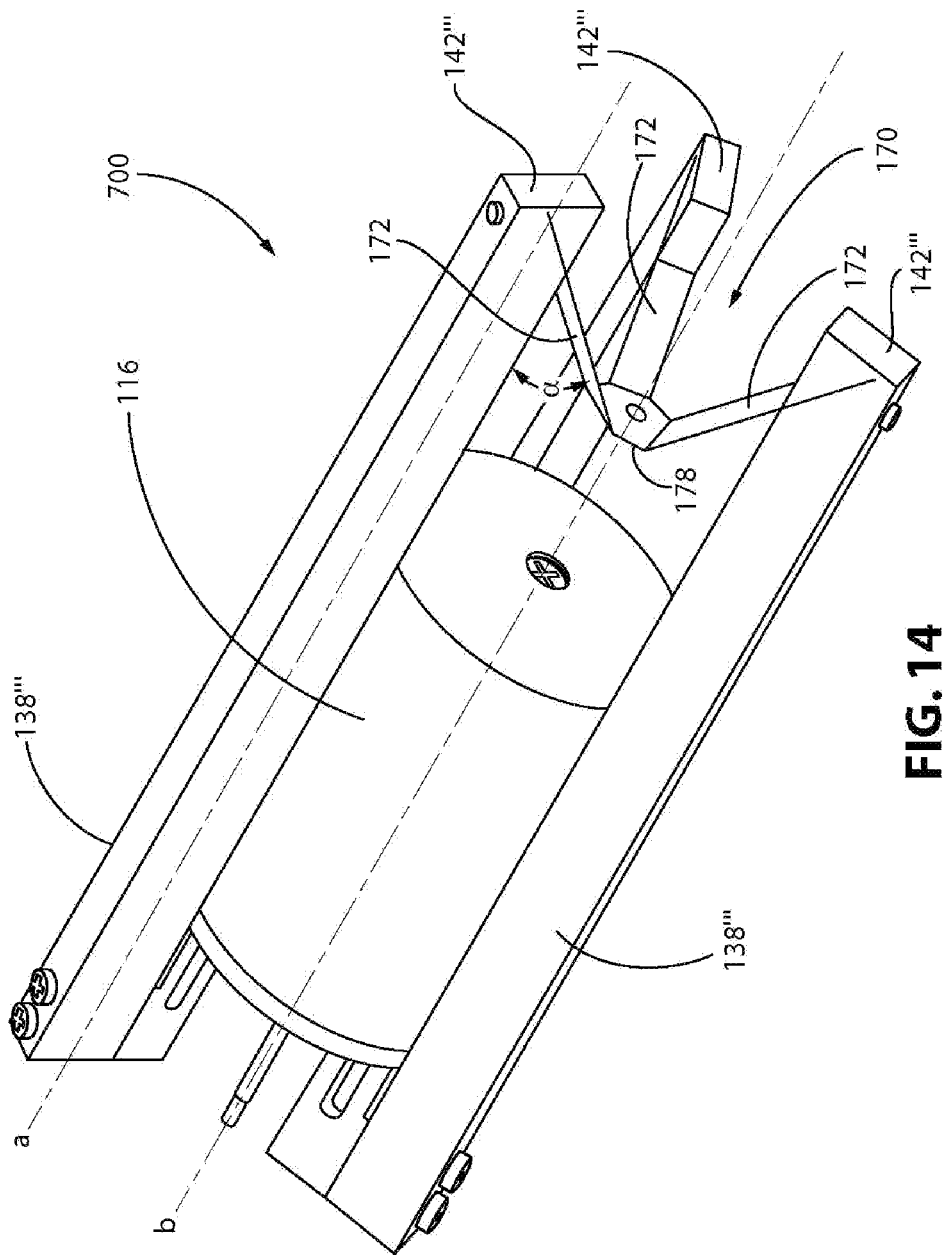
FIG. 14 is a perspective view of a preferred embodiment of the actuator assembly of the apparatus of the present invention having three actuating arms and an inwardly facing second stage.

Referring to FIG. 14, a further embodiment of the actuator apparatus of the present invention is illustrated. Actuator assembly with inwardly facing second stage 700 is substantially similar to actuator apparatus with second stage 100 illustrated in FIG. 1. The primary differences are that second stage assembly 170 with integral mounting surface 178 is utilized instead of second stage assembly 150 with attached mounting surface 158, and second stage assembly 170 is mounted in an inward-facing direction. In certain embodiments, mounting second stage assembly 170 in an inward-facing direction will require that actuating arms 138'" be longer in order to enable sufficient space for second stage assembly 170. Additionally second actuating arm ends 142'" are adapted to receive resilient strips 172 at an inward-facing angle, thus resulting in an angle $\alpha$ that is less than ninety degrees. A relevant feature of this embodiment is that substantially upon activation second stage attachment surface 178 moves toward compensator 116. As a result, actuator assembly with inwardly facing second stage 700 operates in the opposite direction to actuator apparatus assembly with second stage 100. It can thus be seen how, with appropriate actuating arms 138, 138', 138", 138'", actuator apparatuses of the present invention can be configured such that second stage assemblies 150, 170, 180 actuate in either toward compensator 116, 116' or away from compensator 116, 116', thereby allowing for use in still further applications.

Other variations and embodiments of the present invention will be apparent to those of ordinary skill in the art in light of this specification, all of which are within the scope of the present invention as claimed. Nothing in the foregoing description is intended to imply that the present invention is limited to the preferred embodiments described herein.

I claim:

1. An actuator apparatus comprising a smart material device, a compensator, a movable supporting member, at least three mechanical webs, at least three actuating arms, and a second stage assembly wherein
   (a) said mechanical webs comprise a first resilient member attached to said compensator and a second resilient member attached to said movable supporting member
   (b) said movable supporting member comprises a first mounting surface,
   (c) said mechanical webs are spaced around said movable supporting member;
   (d) said smart material device is affixed between said first mounting surface and said compensator;
   (e) said actuating arms comprise a first actuating arm end attached to one said mechanical web and an opposed second actuating arm end attached to said second stage assembly; and
   (f) said second stage assembly comprises resilient strips having a first resilient strip end attached to said second actuating arm end and a second resilient strip end attached to a second stage attachment surface
   wherein
   application of an electrical potential causes said smart material device to expand, thereby urging said movable supporting member away from said compensator and causing said first and second resilient members to flex, thereby moving said actuating arms and causing said resilient strips to urge said second stage attachment surface in a direction substantially parallel to said smart material device.

2. The actuator apparatus of claim 1 wherein said resilient strips are integral with said second stage attachment surface.

3. The actuator apparatus of claim 1 wherein said second stage attachment surface is removably attached to said resilient strips.

4. The actuator apparatus of claim 1 wherein said resilient strips are formed of a material selected from the group consisting of spring steel, carbon fiber, fiberglass, plastic, stainless steel, and aluminum.

5. The actuator apparatus of claim 1 wherein said second stage attachment surface is formed of a material selected from the group consisting of carbon fiber, spring steel, fiberglass, plastic, stainless steel, and aluminum.

6. The actuator apparatus of claim 1 wherein
   (a) said actuating arms are each of substantially the same length and said spacing of said resilient members is substantially even such that the distance between each two adjacent resilient members is substantially identical;
   (b) said actuating arms are spaced radially about said smart material device; and
   (c) said mechanical webs are adapted such that substantially upon flexing of said resilient members said second actuating arm ends move toward said smart material device.

7. The actuator apparatus of claim 1 wherein
   (a) a central axis through the center of said smart material device extends through the center of said first mounting surface;
   (b) for each said actuating arm, an actuating arm axis extends through said actuating arm's first actuating arm end and said second actuating arm's second actuating arm end; and
   (c) the angle between said central axis and each said actuating arm axis is at least ninety-one degrees and at most one hundred thirty-five degrees.

8. The actuator apparatus of claim 1 wherein
   (a) a central axis through the center of said smart material device extends through the center of said first mounting surface;
   (b) for each said actuating arm, an actuating arm axis extends through said actuating arm's first actuating arm end and said second actuating arm's second actuating arm end; and
   (c) the angle between said central axis and each said actuating arm axis is at least forty-five degrees and at most ninety degrees.

9. The actuator apparatus of claim 1 wherein
   (a) a central axis through the center of said smart material device extends through the center of said first mounting surface;
   (b) for each actuating arm, an actuating arm axis extends through said actuating arm's first actuating arm end and said second actuating arm's second actuating arm end; and
   (c) the angles between said central axis and each said actuating arm axis is no more than fifty degrees.

10. The actuator apparatus of claim 1 wherein
    (a) a central axis through the center of said smart material device extends through the center of said first mounting surface;
    (b) for each actuating arm, an actuating arm axis extends through said actuating arm's first actuating arm end and said second actuating arm's second actuating arm end; and
    (c) the angle between said central axis and each said actuating arm axis is at least one hundred thirty degrees and no more than one hundred eighty degrees.

11. The actuator apparatus of claim 1 wherein said actuating arms are removably attached to said mechanical webs and at least one said mechanical web is formed of a different material than at least one said actuating arm.

12. The actuator apparatus of claim 1 further comprising at least one dampener attached to said compensator and movably attached to at least one said actuating arm, said dampener comprising a pliable stop between said actuating arm and said compensator.

13. The actuator apparatus of claim 1 further comprising at least one dampener fixedly attached to an outer frame and movably attached to at least one said actuating arm, said dampener comprising a pliable stop between said actuating arm and said compensator.

14. The actuator apparatus of claim 1 further comprising at least one dampener movably attached to an outer frame and fixedly attached to at least one said actuating arm, said dampener comprising a pliable stop adjacent said compensator.

15. An actuator apparatus comprising a smart material device, a compensator, a movable supporting member, at least three mechanical webs, at least three actuating arms, and a second stage assembly wherein
    (a) said mechanical webs comprise a first resilient member attached to said compensator and a second resilient member attached to said movable supporting member
    (b) said movable supporting member comprises a first mounting surface substantially centered within said movable supporting member, (c) said mechanical webs are spaced around said movable supporting member;

(e) said smart material device is affixed between said first mounting surface and said compensator;

(f) said actuating arms comprise a first actuating arm end attached to one said mechanical web and an opposed second actuating arm end attached to said second stage assembly; and (g) said second stage assembly comprises resilient convex member attached to said second actuating arm end wherein application of an electrical potential causes said smart material device to expand, thereby urging said movable supporting member away from said compensator and causing said first and second resilient members to flex, thereby moving said actuating arms and causing a central point of said resilient convex member to move in a direction substantially parallel to said smart material device.

16. The actuator apparatus of claim 15 wherein said resilient convex member is removably attached to said second actuating arm ends.

17. The actuator apparatus of claim 15 wherein said resilient convex member is formed of a material selected from the group consisting of spring steel, carbon fiber, fiberglass, plastic, stainless steel, and aluminum.

18. The actuator apparatus of claim 15 wherein said resilient convex member is substantially semispherical in shape.

19. The actuator apparatus of claim 15 further comprising at least one dampener attached to said compensator and movably attached to at least one said actuating arm, said dampener comprising a pliable stop between said actuating arm and said compensator.

* * * * *